US011957016B2

(12) United States Patent
Kwak et al.

(10) Patent No.: US 11,957,016 B2
(45) Date of Patent: Apr. 9, 2024

(54) DISPLAY APPARATUS WITH DISPLAY AREA HAVING A NON-QUADRANGULAR SHAPE

(71) Applicant: Samsung Display Co., Ltd., Yongin-si (KR)

(72) Inventors: Minchae Kwak, Yongin-si (KR); Ilgoo Youn, Yongin-si (KR); Byungsun Kim, Yongin-si (KR); Jieun Lee, Yongin-si (KR); Seunghan Jo, Yongin-si (KR); Junyoung Jo, Yongin-si (KR); Minhee Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/552,749

(22) Filed: Dec. 16, 2021

(65) Prior Publication Data

US 2022/0109043 A1 Apr. 7, 2022

Related U.S. Application Data

(63) Continuation of application No. 16/898,232, filed on Jun. 10, 2020, now Pat. No. 11,217,653.

(30) Foreign Application Priority Data

Jul. 29, 2019 (KR) .......................... 10-2019-0092034

(51) Int. Cl.
*H01L 29/08* (2006.01)
*G09G 3/3266* (2016.01)
(Continued)

(52) U.S. Cl.
CPC ......... *H10K 59/131* (2023.02); *G09G 3/3266* (2013.01); *G09G 3/3275* (2013.01);
(Continued)

(58) Field of Classification Search
CPC ............. H10K 59/131; H10K 59/1213; H10K 59/1216; G09G 2330/12
(Continued)

(56) References Cited

U.S. PATENT DOCUMENTS 8,643,572 B2 * 2/2014 Asano .................. G09G 3/3233
345/82
9,622,342 B2 4/2017 Kim et al.
(Continued)

FOREIGN PATENT DOCUMENTS

KR 20150047022 A * 5/2015 .......... G09G 3/3233
KR 10-2015-0085668 A 7/2015
(Continued)

*Primary Examiner* — Phuc T Dang
(74) *Attorney, Agent, or Firm* — Lewis Roca Rothgerber Christie LLP

(57) ABSTRACT

A display apparatus includes: a plurality of pixel circuits at a display area, the display area having a non-quadrangular shape; a first signal line extending on the display area in a first direction, and electrically connected to a first pixel circuit from among the plurality of pixel circuits; a first voltage line extending on the display area in the first direction; a first load compensation capacitor adjacent to an end portion of the first signal line and an end portion of the first voltage line; a test circuit outside the display area; an output line electrically connected to the test circuit; and a connection portion configured to electrically connect the output line, the first signal line, and an electrode of the first load compensation capacitor to each other.

19 Claims, 21 Drawing Sheets

(51) Int. Cl.
  *G09G 3/3275* (2016.01)
  *H10K 59/121* (2023.01)
  *H10K 59/131* (2023.01)

(52) U.S. Cl.
  CPC ..... *H10K 59/1213* (2023.02); *H10K 59/1216* (2023.02); *G09G 2330/12* (2013.01)

(58) Field of Classification Search
  USPC .......................................................... 257/40
  See application file for complete search history.

(56) References Cited

U.S. PATENT DOCUMENTS

| | | | |
|---|---|---|---|
| 10,157,565 | B2 | 12/2018 | Shin et al. |
| 10,170,534 | B1 * | 1/2019 | Kim ..................... G09G 3/3233 |
| 10,403,209 | B2 * | 9/2019 | Wang .................... H10K 77/10 |
| 10,461,070 | B2 | 10/2019 | Kim et al. |
| 11,217,653 | B2 * | 1/2022 | Kwak .................. H10K 59/131 |
| 2006/0195736 | A1 | 8/2006 | Hayashi |
| 2007/0146246 | A1 * | 6/2007 | Nakamura ........... H10K 59/131 345/76 |
| 2009/0224245 | A1 | 9/2009 | Umezaki |
| 2017/0025070 | A1 * | 1/2017 | Kang .................. G09G 3/3266 |
| 2018/0129106 | A1 | 5/2018 | Gao et al. |
| 2018/0158417 | A1 | 6/2018 | Xiang et al. |
| 2018/0342194 | A1 | 11/2018 | Li et al. |
| 2019/0197965 | A1 | 6/2019 | Park et al. |
| 2020/0176551 | A1 | 6/2020 | Park et al. |

FOREIGN PATENT DOCUMENTS

| | | | |
|---|---|---|---|
| KR | 10-2016-0095241 A | 8/2016 |
| KR | 10-2019-0008459 A | 1/2019 |
| KR | 10-2020-0066471 A | 6/2020 |

* cited by examiner

DISPLAY APPARATUS WITH DISPLAY AREA HAVING A NON-QUADRANGULAR SHAPE

CROSS-REFERENCE TO RELATED APPLICATIONS

This application is a continuation of U.S. patent application Ser. No. 16/898,232, filed Jun. 10, 2020, now U.S. Pat. No. 11,217,653, which claims priority to and the benefit of Korean Patent Application No. 10-2019-0092034, filed Jul. 29, 2019, the entire content of all of which is incorporated herein by reference.

BACKGROUND

1. Field

One or more aspects of example embodiments relate to a display apparatus, and more particularly, to a non-quadrangular display apparatus.

2. Description of Related Art

With the rapid development of display apparatuses for visually representing various electrical signal information, a variety of display apparatuses having excellent characteristics, for example, such as slimness, light weight, and low power consumption, has been introduced. A display apparatus includes a plurality of pixels arranged at (e.g., in or on) a display area, and one or more driving circuits disposed around (e.g., adjacent to or to surround a periphery of) the display area and for driving the plurality of pixels. Recently, a demand for display apparatuses having various shapes, for example, such as display apparatuses having a non-quadrangular shape, is increasing. However, when the display area of the display apparatus has a non-quadrangular shape, a dead area of the display apparatus may be increased, and an area of the display area may be reduced. Accordingly, a display apparatus in which a dead area is reduced, and/or in which the area of the display area is increased may be desired.

The above information disclosed in this Background section is for enhancement of understanding of the background of the present disclosure, and therefore, it may contain information that does not constitute prior art.

SUMMARY

One or more embodiments are directed to a non-quadrangular display apparatus.

Additional aspects and/or features will be set forth in part in the description which follows, and in part, will become apparent from the description of the example embodiments, or may be learned by practicing one or more of the example embodiments of the present disclosure.

According to one or more embodiments, a display apparatus includes: a plurality of pixel circuits at a display area having a non-quadrangular shape; a first signal line extending on the display area in a first direction, and electrically connected to a first pixel circuit from among the plurality of pixel circuits; a first voltage line extending on the display area in the first direction; a first load compensation capacitor adjacent to an end portion of the first signal line and an end portion of the first voltage line; a test circuit outside the display area; an output line electrically connected to the test circuit; and a connection portion configured to electrically connect the output line, the first signal line, and an electrode of the first load compensation capacitor to each other.

In an embodiment, the connection portion may be between the first pixel circuit and the first load compensation capacitor.

In an embodiment, the first load compensation capacitor may include a first electrode and a second electrode that overlap each other, and one from among the first electrode and the second electrode may be electrically connected to the output line and the first signal line via the connection portion.

In an embodiment, the other one from among the first electrode and the second electrode may be electrically connected to the first voltage line.

In an embodiment, the first load compensation capacitor may further include a third electrode that overlaps the first electrode and the second electrode.

In an embodiment, the third electrode may be electrically connected to the first voltage line.

In an embodiment, the first pixel circuit may include: a first thin-film transistor including a first semiconductor layer and a first gate electrode, a portion of the first gate electrode overlapping the first semiconductor layer; a first capacitor electrically connected to the first thin-film transistor; and a second thin-film transistor on the first thin-film transistor, and including a second semiconductor layer and a second gate electrode, a portion of the second gate electrode overlapping the second semiconductor layer.

In an embodiment, one from among the first semiconductor layer and the second semiconductor layer may include a silicon semiconductor, and the other one from among the first semiconductor layer and the second semiconductor layer may include an oxide semiconductor.

In an embodiment, the first load compensation capacitor may include at least two electrodes, one of the at least two electrodes including the same material as that of the first gate electrode or as that of the second gate electrode, and the other one of the at least two electrodes including the same material as that of an electrode of the first capacitor.

In an embodiment, the plurality of pixel circuits may have a stepwise configuration at a periphery of the display area.

In an embodiment, the display apparatus may further include: a second signal line extending on the display area in the first direction, and electrically connected to a second pixel circuit that is different from the first pixel circuit; and a second load compensation capacitor adjacent to an end portion of the second signal line, and having a capacitance that is less than that of the first load compensation capacitor.

In an embodiment, the second load compensation capacitor may be more adjacent to a first virtual line than the first load compensation capacitor, the first virtual line extending through a center of the display area in the first direction.

In an embodiment, the display area may have a circular shape, an oval shape, or a curved polygonal shape.

According to one or more embodiments, a display apparatus includes: a plurality of pixel circuits at a display area having a non-quadrangular shape; a first signal line extending on the display area in a first direction; a load compensation capacitor outside the display area and adjacent to the first signal line, the load compensation capacitor including a first electrode and a second electrode; a connection portion between the first signal line and the load compensation capacitor, the connection portion being configured to connect the first signal line to the load compensation capacitor; a test circuit outside the display area; and an output line configured to electrically connect the test circuit to the connection portion.

In an embodiment, the connection portion may include a conductive layer between the second electrode of the load compensation capacitor and the first signal line, or a conductive layer between the second electrode of the load compensation capacitor and the output line.

In an embodiment, the display apparatus may further include a first power supply line adjacent to the first signal line, and extending through the display area, and the first electrode of the load compensation capacitor may be electrically connected to the first power supply line.

In an embodiment, the load compensation capacitor may further include a third electrode located opposite the first electrode with the second electrode therebetween.

In an embodiment, one of the plurality of pixel circuits may include: a first thin-film transistor including a first semiconductor layer and a first gate electrode, a portion of the first gate electrode overlapping the first semiconductor layer; a first capacitor electrically connected to the first thin-film transistor; and a second thin-film transistor including a second semiconductor layer and a second gate electrode, a portion of the second gate electrode overlapping the second semiconductor layer.

In an embodiment, the second thin-film transistor may be at a different layer from that of the first thin-film transistor.

In an embodiment, the first electrode and the second electrode of the load compensation capacitor may include the same material as that of the first gate electrode, electrodes of the first capacitor, or the second gate electrode.

In an embodiment, the first semiconductor layer and the second semiconductor layer may include different materials from each other.

In an embodiment, the first semiconductor layer may include a silicon semiconductor, and the second semiconductor layer may include an oxide semiconductor.

In an embodiment, the plurality of pixel circuits may have a stepwise configuration at a periphery of the display area.

In an embodiment, the display apparatus may further include a pad at one side of the display area, and the load compensation capacitor may be located at an opposite side from that of the pad relative to a virtual line that extends through a center of the display area in a second direction that crosses the first direction.

In an embodiment, the display area may have a circular shape or an oval shape.

BRIEF DESCRIPTION OF THE DRAWINGS

The above and other aspects and features of the present disclosure will be more apparent to those skilled in the art from the following detailed description with reference to the accompanying drawings, in which.

DETAILED DESCRIPTION

Figure 1:
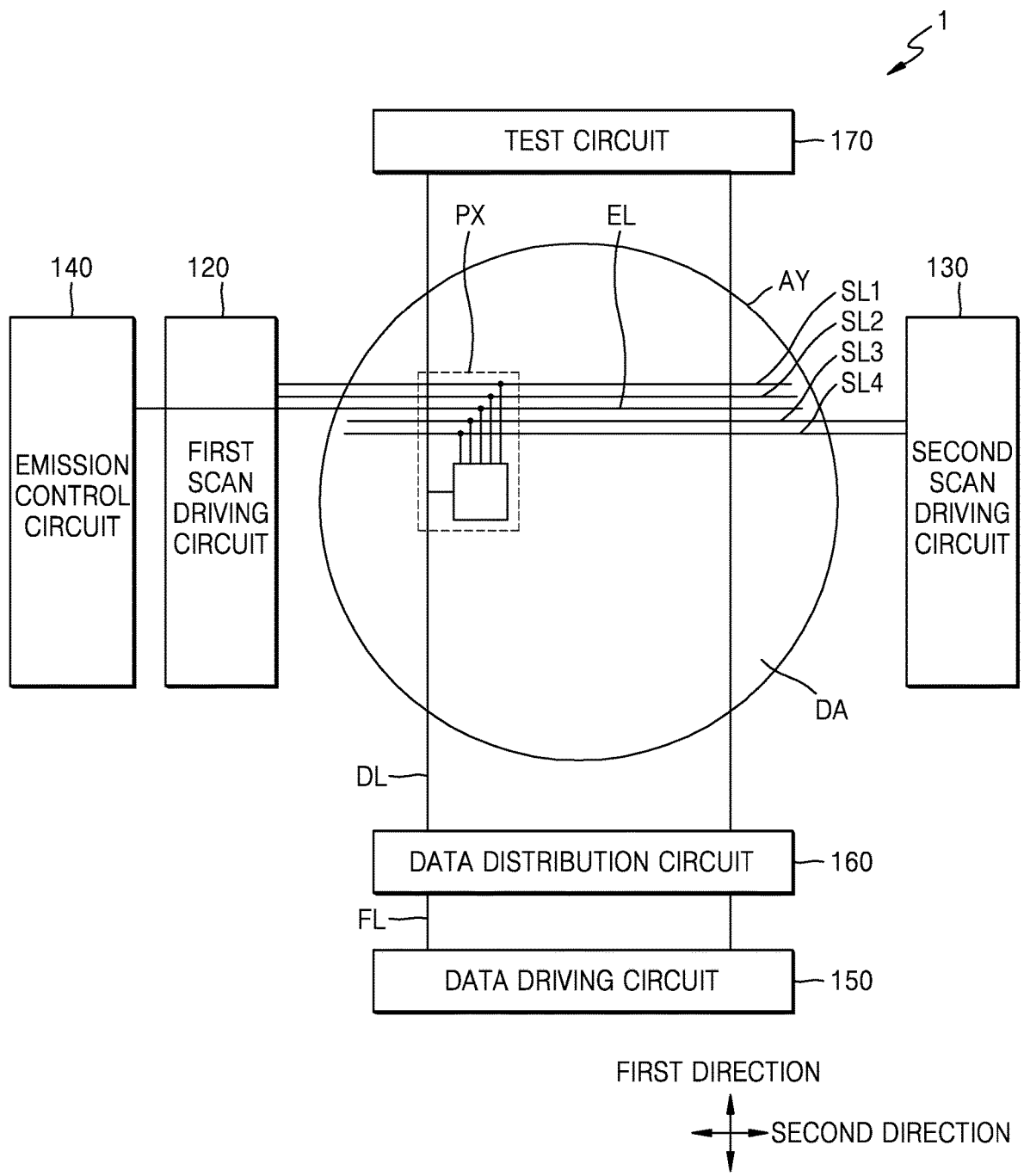
FIG. 1 is a block diagram schematically illustrating a display apparatus according to an embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

When a particular embodiment may be implemented differently, a specific process order may be performed differently from the described order. For example, two consecutively described processes may be performed at the same or substantially the same time, or may be performed in an order that is opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. For example, it will be understood that when a layer, region, or component is referred to as being "formed on," another layer, region, or component, it can be directly or indirectly formed on the other layer, region, or component. That is, for example, intervening layers, regions, or components may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, throughout the disclosure, expressions such as "at least one of a, b or c" may indicate only a, only b, only c, both a and b, both a and c, both b and c, all of a, b, and c, and/or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram schematically illustrating a display apparatus according to an embodiment.

Referring to FIG. 1, a display apparatus 1 may include a pixel array AY. The pixel array AY may include a plurality of pixels PX, and the plurality of pixels PX may be arranged according to a prescribed rule. The pixel array AY may display an image to a user.

The plurality of pixels PX may be electrically connected to a plurality of signal lines, respectively. Further, each of the pixels PX may be connected to a plurality of signal lines from among the signal lines. For example, the signal lines that are connected to each of the pixels PX may include a data line DL, a first scan line SL1, a second scan line SL2, a third scan line SL3, a fourth scan line SL4, and an emission control line EL. The data line DL may extend in a first direction. The first through fourth scan lines SL1 to SL4 and the emission control line EL may extend in a second direction crossing the first direction.

The signal lines described above may be electrically connected to one or more driving circuits that are located outside of a display area DA. For example, the driving circuits may include a first scan driving circuit 120, a second scan driving circuit 130, an emission control circuit 140, and a data driving circuit 150.

The first scan driving circuit 120 may output a plurality of scan signals, and may provide a first scan signal and a second scan signal to each of the pixels PX via the first scan line SL1 and the second scan line SL2, respectively. The second scan driving circuit 130 may output a plurality of scan signals, and may provide a third scan signal and a fourth scan signal to each of the pixels PX via the third scan line SL3 and the fourth scan line SL4, respectively. The emission control circuit 140 may output an emission control signal, and the emission control signal may be provided to each pixel PX via the emission control line EL (e.g., via a corresponding emission control line EL).

The data driving circuit 150 may output a plurality of data signals, and may provide the plurality of data signals to each pixel PX via the data line DL (e.g., via a corresponding data line DL).

A data distribution circuit 160 may be disposed between the data driving circuit 150 and the display area DA. The data distribution circuit 160 may transmit the data signals from the data driving circuit 150 to the data line DL. For example, the data distribution circuit 160 may time-divide a data signal, and may distribute the divided data signals to the plurality of data lines DL. The data signal may be applied to the data distribution circuit 160 through an output line (e.g., one output line or a corresponding output line) FL of the data driving circuit 150. The data distribution circuit 160 may include a plurality of de-multiplexers, and each of the plurality of de-multiplexers may correspond to one of the output lines FL. For example, the plurality of de-multiplexers may have the same or substantially the same number as that of the output lines FL. When the display apparatus 1 includes the data distribution circuit 160, a spacing (or a space) of the signal lines, for example, the data lines DL, at (e.g., in or on) an outer area PA (e.g., see FIG. 2) may be reduced. In another embodiment, the data distribution circuit 160 that is between the data driving circuit 150 and the display area DA may be omitted.

In some embodiments, a test circuit 170 may apply test signals to the data lines DL. The test circuit 170 may include a plurality of switching elements, for example, a plurality of transistors. The test circuit 170 may apply test signals to check whether the pixels PX are operating normally.

Figure 2:
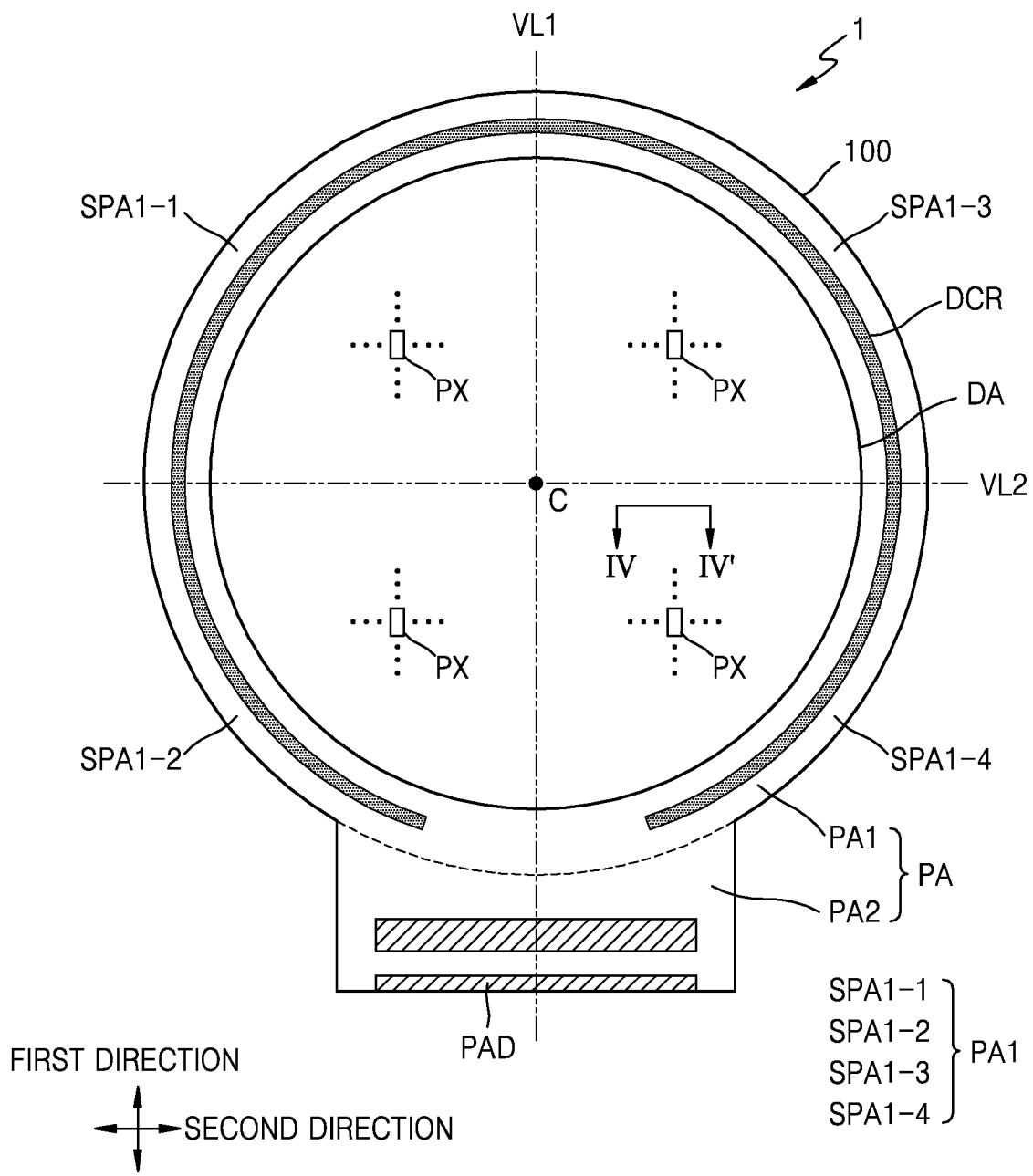
FIG. 2 is a plan view schematically illustrating a display apparatus according to an embodiment.

FIG. 2 is a plan view schematically illustrating a display apparatus according to an embodiment. For example, FIG. 2 is a view of the display apparatus 1 from a plane that is parallel or substantially parallel to a top surface of the display apparatus 1.

Referring to FIG. 2, the display apparatus 1 may include the display area DA and the outer area PA that surrounds (e.g., around a periphery of) the display area DA.

The display area DA is an area at (e.g., in or on) which an image is displayed. The plurality of pixels PX at (e.g., in or on) which an image may be displayed, are arranged at (e.g., in or on) the display area DA of the display apparatus 1. The display area DA may have a non-quadrangular shape. For example, the display area DA may have various suitable shapes that are non-quadrangular (e.g., excluding a square shape, a rectangular shape, and/or the like), for example, such as a circular shape, an oval shape, a polygonal shape having a curved part, and/or the like.

The outer area PA may be an area at (e.g., in or on) which the plurality of pixels PX are not arranged, and thus, may not provide an image. Thus, the outer area PA may be a non-display area, and may entirely surround (e.g., around a periphery of) the display area DA.

The outer area PA may include a first outer area PA1 that surrounds (e.g., around a periphery of) the display area DA overall, and a second outer area PA2 that protrudes from a first portion of the first outer area PA1 in a desired direction (e.g., one direction). For example, the first outer area PA1 may extend along ends (e.g., periphery edges or the peripheral edge) of the display area DA having the non-quadrangular shape, and may have a ring shape with a particular (or certain) width. The second outer area PA2 may be at a side (e.g., one side) of the first outer area PA1, and may be connected to the first outer area PA1. The second outer area PA2 may be bent (e.g., or folded), and may overlap with a part (or a portion) of the first outer area PA1.

The plan view of the display apparatus 1 shown in FIG. 2 may be a plan view (e.g., a view from a plane that is parallel or substantially parallel to (or normal to) a top surface) of a substrate 100 of the display apparatus 1. For example, the substrate 100 may have the same or substantially the same shape as that of the display apparatus 1. The substrate 100 may include a first area corresponding to the display area DA of the display apparatus 1 and a second area corresponding to the outer area PA of the display apparatus 1. The first area of the substrate 100 may have a non-quadrangular shape corresponding to the shape of the display area DA. For example, the first area of the substrate 100 may have various suitable shapes that are non-quadrangular (e.g., excluding a square shape, a rectangular shape, and/or the like), for example, such as a circular shape, an oval shape, a polygonal shape having a curved part, and/or the like. The second area of the substrate 100 having a shape corresponding to that of the outer area PA may include a second-first area corresponding to the first outer area PA1, and a second-second area corresponding to the second outer area PA2.

The driving circuits may be disposed at (e.g., in or on) the outer area PA. A part (or a portion) of the driving circuits may at least partially surround (e.g., around at least a portion of the periphery of) the display area DA. In this regard, FIG. 2 illustrates that a driving circuit region DCR at (e.g., in or on) which the driving circuits are disposed is located at (e.g., in or on) the first outer area PA1 of the outer area PA.

In an embodiment, the first scan driving circuit 120, the second scan driving circuit 130, and the emission control circuit 140 that are described above with reference to FIG. 1 may be positioned at (e.g., in or on) the driving circuit region DCR. The data distribution circuit 160 and the test circuit 170 may be positioned at (e.g., in or on) the driving circuit region DCR. Each of the first scan driving circuit 120, the second scan driving circuit 130, the emission control circuit 140, the data distribution circuit 160, and the test circuit 170 may include a plurality of sub-circuits. The plurality of sub-circuits may be disposed at (e.g., in or on) the outer area PA, for example, at (e.g., in or on) the first outer area PA1. The first outer area PA1 may include a plurality of areas. For example, in an embodiment as illustrated in FIG. 2, the first outer area PA1 includes a plurality of first through fourth sub-outer areas SPA1-1, SPA1-2, SPA1-3, and SPA1-4. The first through fourth sub-outer areas SPA1-1, SPA1-2, SPA1-3, and SPA1-4 may be defined by (e.g., or partitioned into) a first virtual line VL1 at (e.g., in or on) which the first outer area PA1 passes through a center (or central portion) C of the display area DA and extends in the first direction, and a second virtual line VL2 at (e.g., in or on) which the first outer area PA1 passes through the center C of the display area DA and extends in the second direction.

Sub-circuits of the first scan driving circuit 120, sub-circuits of the emission control circuit 140, and sub-circuits of the test circuit 170 may be arranged at (e.g., in or on) the first sub-outer area SPA1-1. Sub-circuits of the first scan driving circuit 120, sub-circuits of the emission control circuit 140, and sub-circuits of the data distribution circuit 160 may be arranged at (e.g., in or on) the second sub-outer area SPA1-2. Sub-circuits of the second scan driving circuit 130 and sub-circuits of the test circuit 170 may be arranged at (e.g., in or on) the third sub-outer area SPA1-3. Sub-circuits of the second scan driving circuit 130 and sub-circuits of the data distribution circuit 160 may be arranged at (e.g., in or on) the fourth sub-outer area SPA1-4.

The data driving circuit 150 may be disposed at (e.g., in or on) the second outer area PA2. In an embodiment, as shown in FIG. 2, the data driving circuit 150 may be disposed (e.g., directly disposed) at (e.g., in or on) the second outer area PA2 as a chip on glass (COG) type or as a chip on plastic (COP) type. In another embodiment, the data driving circuit 150 may be disposed on an additional flexible film as a chip on film (COF) type. In this case, the flexible film on which the data driving circuit 150 is provided may be connected to (e.g., attached to) a pad "PAD" at (e.g., in or on) the outer area PA (e.g., at the second outer area PA2).

Figure 3:
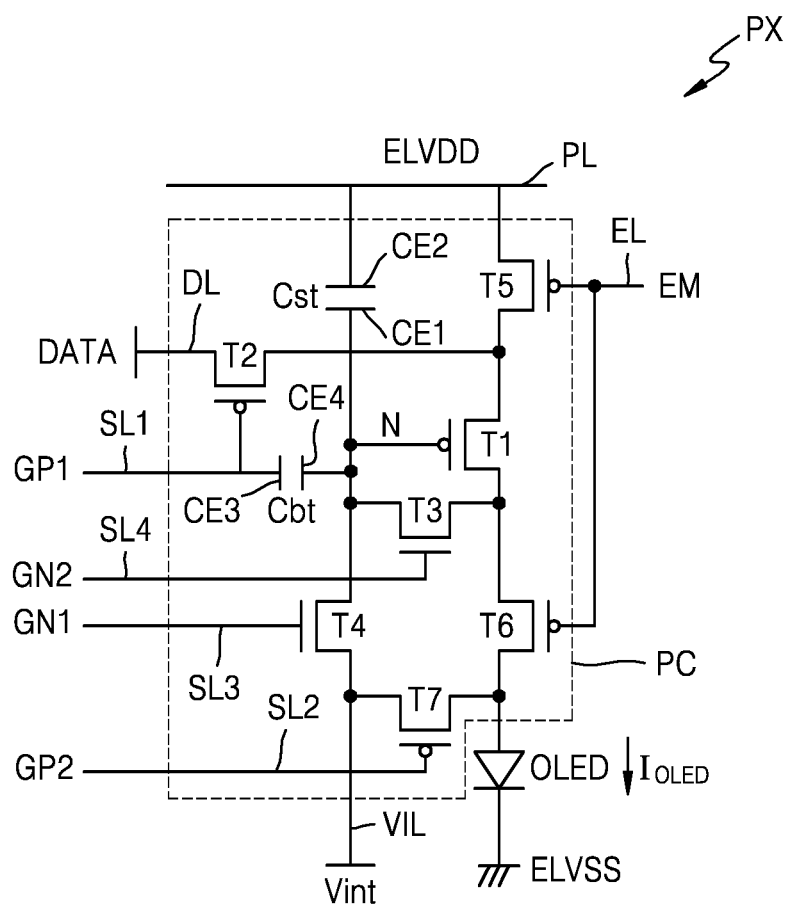
FIG. 3 is an equivalent circuit diagram of a pixel of a display apparatus according to an embodiment.

FIG. 3 is an equivalent circuit diagram of a pixel of a display apparatus according to an embodiment.

Referring to FIG. 3, a pixel PX includes a plurality of first through seventh transistors T1, T2, T3, T4, T5, T6, and T7, a first capacitor Cst, a second capacitor Cbt, a display element (e.g., an organic light-emitting diode) OLED, a plurality of signal lines SL1, SL2, SL3, SL4, EL, and DL that are connected to the pixel PX, an initialization voltage line VIL, and a power voltage line PL. In another embodiment, at least one of the signal lines SL1, SL2, SL3, SL4, EL, and DL, the initialization voltage line VIL, and/or the power voltage line PL may be shared with adjacent pixels. The first through seventh transistors T1 through T7 may be implemented with thin-film transistors. In FIG. 3, the third transistor T3 and the fourth transistor T4 from among the first through seventh transistors T1 to T7 are implemented with n-channel metal oxide semiconductor (NMOS) field-effect transistors (FETs) (e.g., NMOSFETs), and the other remaining transistors from among the first through seventh transistors T1 to T7 may be implemented with p-channel MOSFETs (e.g., PMOSFETs).

The signal lines may include a data line DL, a first scan line SL1, a second scan line SL2, a third scan line SL3, a fourth scan line SL4, and an emission control line EL. In an embodiment, the plurality of second scan lines SL2 may be connected to the plurality of first scan lines SL1. In this case, a first scan signal GP1 may include (e.g., may be) a second scan signal GP2.

The power voltage line PL may transmit a first power voltage ELVDD to the first transistor T1, and the initialization voltage line VIL may transmit an initialization voltage Vint for initializing the first transistor T1 and the organic light-emitting diode OLED of the pixel PX.

The first scan lines SL1, the second scan lines SL2, the third scan lines SL3, the fourth scan lines SL4, the plurality of emission control lines EL, and the initialization voltage line VIL may extend in any suitable direction (e.g., the second direction), and may be spaced apart from one another (e.g., from each other). The plurality of data lines DL and the power voltage line PL may extend in another suitable direction (e.g., the first direction), and may be spaced apart from one another (e.g., from each other).

The first transistor T1 may be connected to the power voltage line PL via the fifth transistor T5, and may be electrically connected to the organic light-emitting diode OLED via the sixth transistor T6. The first transistor T1 may function as a driving transistor, for example, such that the first transistor T1 may receive a signal corresponding to data signal DATA according to a switching operation of the second transistor T2, and may supply a driving current IDLED to the organic light-emitting diode OLED.

The second transistor T2 may be connected to the first scan line SL1 and the data line DL, and may be connected to the power voltage line PL via the fifth transistor T5. The second transistor T2 may be turned on according to the first scan signal GP1 that are transmitted via the first scan line SL1, and may perform a switching operation of transmitting the data signal DATA that are transmitted from the data line DL to a node N. For example, when the second transistor T2 is turned on according to the first scan signal GP1, the second transistor T2 may transmit the data signal DATA from the data line DL through the first transistor T1 and the third transistor T3 to the node N.

The third transistor T3 may be connected to the fourth scan line SL4, and may be connected to the organic light-emitting diode OLED via the sixth transistor T6. The third transistor T3 may be turned on according to a fourth scan signal GN2 transmitted via the fourth scan line SL4, and may diode-connect the first transistor T1.

The fourth transistor T4 may be connected to the third scan line SL3 and the initialization voltage line VIL. The fourth transistor T4 may be turned on according to a third scan signal GN1 that is transmitted via the third scan line SL3, and may transmit the initialization voltage Vint from the initialization voltage line VIL to a gate electrode of the first transistor T1. Accordingly, the fourth transistor T4 may initialize a voltage of the gate electrode of the first transistor T1.

Each of the fifth transistor T5 and the sixth transistor T6 may be connected to the emission control line EL. The fifth transistor T5 and the sixth transistor T6 may be concurrently (e.g., simultaneously) turned on according to the emission control signal EM transmitted via the emission control line EL, and may form a current path (e.g., with the first transistor T1) on which the driving current $I_{OLED}$ may flow from the power voltage line PL in a direction toward the organic light-emitting diode OLED.

The seventh transistor T7 may be connected to each of the second scan line SL2 and the initialization voltage line VIL, and may be turned on according to the second scan signal GP2 that is transmitted via the second scan line SL2. When the seventh transistor T7 is turned on, the seventh transistor T7 may transmit the initialization voltage Vint from the initialization voltage line VIL to the organic light-emitting diode OLED, thereby initializing the organic light-emitting diode OLED. However, the present disclosure is not limited thereto, and in another embodiment, the seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the power voltage line PL. The first capacitor Cst may define (e.g., may be) a storage capacitor. For example, the first capacitor Cst may store and maintain or substantially maintain a voltage corresponding to a difference between voltages (e.g., both-end voltages) of the power voltage line PL and the gate electrode of the first transistor T1, thereby maintaining or substantially maintaining the voltage that is applied to the gate electrode of the first transistor T1.

The second capacitor Cbt may include a third electrode CE3 and a fourth electrode CE4. The third electrode CE3 may be connected to the first scan line SL1 and a gate electrode of the second transistor T2. The fourth electrode CE4 may be connected to the gate electrode of the first transistor T1 and the first electrode CE1 of the first capacitor Cst. The second capacitor Cbt may define (or may be) a boosting capacitor, for example, such that the second capacitor Cbt may increase a voltage of the node N so as to reduce a voltage (e.g., a black voltage) for displaying a black image when the first scan signal GP1 of the first scan line SL1 corresponds to (e.g., is or includes) a voltage for turning off the second transistor T2.

The organic light-emitting diode OLED may be electrically connected to a pixel circuit PC, which may include the transistors and capacitors described above. The organic light-emitting diode OLED may include a pixel electrode and an opposite electrode. A second power supply voltage ELVSS may be applied to the opposite electrode. The organic light-emitting diode OLED may receive the driving current IDLED from the first transistor T1, and may emit light according to the driving current IDLED, thereby displaying a desired image.

A detailed operation of the pixel (e.g., each pixel) PX according to an embodiment will be described in more detail below.

During an initialization period, when the third scan signal GN1 is supplied to the pixel (e.g., to each pixel) PX via the third scan line (e.g., via the third scan lines) SL3, the fourth transistor T4 may be turned on according to the third scan signal GN1, and the first transistor T1 may be initialized by the initialization voltage Vint supplied from the initialization voltage line VIL.

During a data programming period, the first scan signal GP1, the second scan signal GP2, and the fourth scan signal GN2 are supplied to the pixels (e.g., to each pixel) PX via the first scan lines SL1, the second scan lines SL2 and the fourth scan lines SL4, respectively, and the second transistor T2, the seventh transistor T7, and the third transistor T3 of the pixels PX may be turned on according to the first scan signal GP1, the second scan signal GP2, and the fourth scan signal GN2. In this case, the first transistor T1 may be diode-connected by the turned-on third transistor T3, and may be biased in a forward direction. Then, a voltage in which a threshold voltage Vth of the first transistor T1 is compensated in the data signal DATA supplied from the data lines DL, may be applied to the gate electrode of the first transistor T1. The organic light-emitting diode OLED may be initialized by the initialization voltage Vint supplied from the initialization voltage line VIL by the turned-on seventh transistor T7. A first power voltage ELVDD and a compensation voltage may be applied to respective ends (e.g., respective electrodes CE1 and CE2) of the first capacitor Cst, and the first capacitor Cst may store a voltage difference corresponding to a difference of the voltages between the first power voltage ELVDD and the compensation voltage.

During an emission period, the fifth transistor T5 and the seventh transistor T6 may be turned on according to the emission control signal EM supplied from the emission control lines EL. The driving current IDLED may be generated due to a voltage difference between a voltage of the gate electrode of the first transistor T1 and the first power voltage ELVDD, and the driving current IDLED may be supplied to the organic light-emitting diode OLED via the sixth transistor T6.

In the present embodiment, at least one of the plurality of transistors T1 to T7 includes a semiconductor layer including an oxide, and at least one of the other remaining ones of the plurality of transistors T1 to T7 may include a semiconductor layer including silicon. In more detail, for example, when a first transistor directly affects the brightness of the display apparatus, the first transistor may be configured to include a semiconductor layer including, for example, polycrystalline silicon, which may have high reliability. Thus, a display apparatus having a high resolution may be implemented.

An oxide semiconductor may have high carrier mobility and a low leakage current, and thus, even when a driving time is long (e.g., is extended), a voltage drop may not be large. In other words, a color change of an image may not be large (e.g., may not be noticeably large) due to a voltage drop, even during low-frequency driving. Thus, a low-frequency driving method may be performed. Because an oxide semiconductor has a low leakage current, at least one from among the third transistor T3 and the fourth transistor T4 connected to the gate electrode of the first transistor T1 may include (e.g., may be employed as) an oxide semiconductor. Accordingly, the leakage current that may flow into the gate electrode of the first transistor T1 may be prevented or substantially prevented, and power consumption may be reduced (e.g., concurrently or simultaneously reduced).

Figure 4:
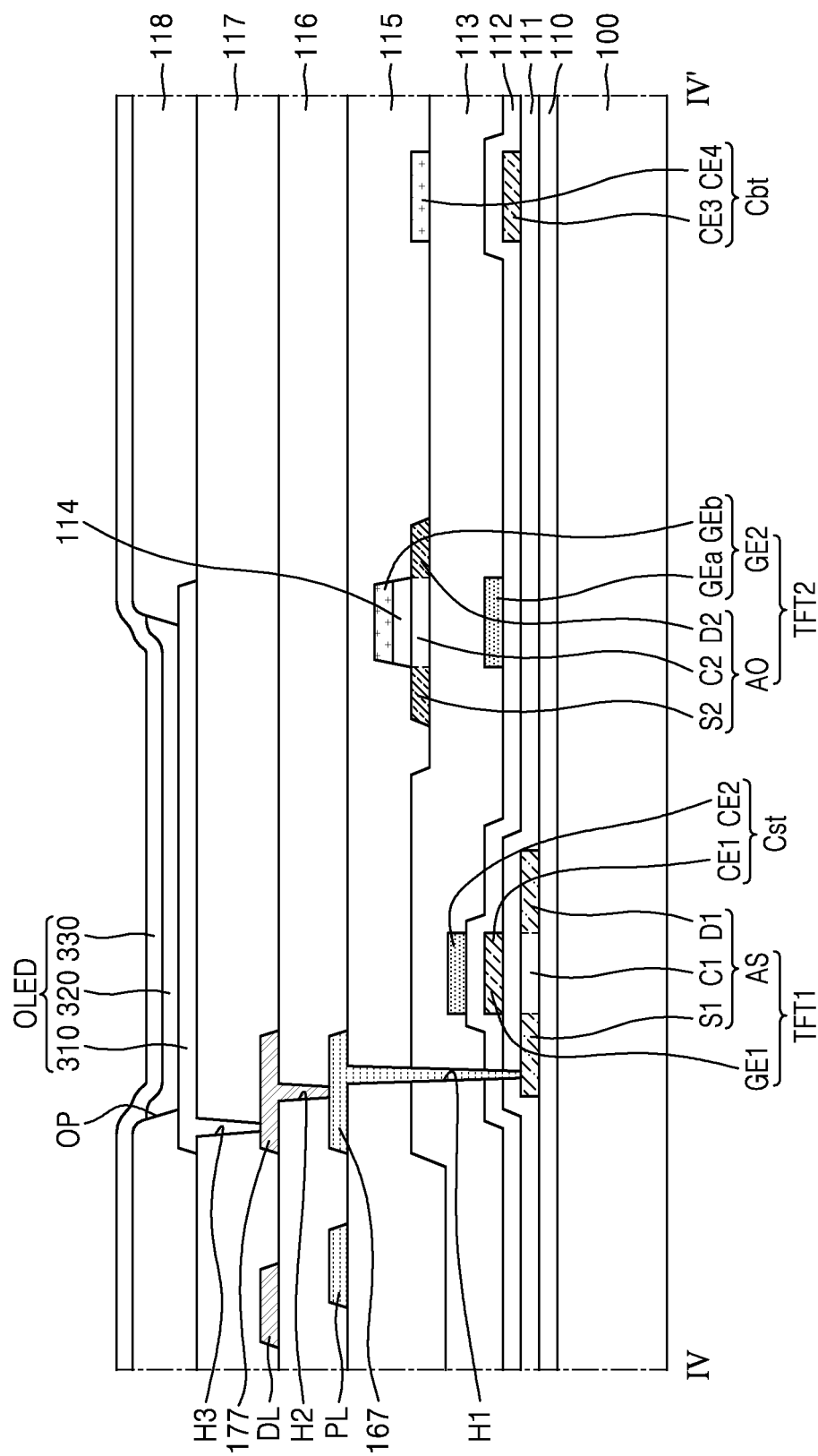
FIG. 4 is a cross-sectional view of the display apparatus taken along the line IV-IV' of FIG. 2 according to an embodiment.

FIG. 4 is a cross-sectional view of the display apparatus taken along the line IV-IV' of FIG. 2 according to an embodiment.

Referring to FIG. 4, the display apparatus of FIG. 2 according an embodiment may include a substrate 100, a first thin-film transistor TFT1 including a silicon semiconductor, a second thin-film transistor TFT2 including an oxide semiconductor, a first capacitor Cst, and a second capacitor Cbt. The first thin-film transistor TFT1 of FIG. 4 may define (e.g., may include or may be) any suitable one from among the first transistor T1, the second transistor T2, the fifth transistor T5, the sixth transistor T6, and the sixth transistor T7 described above with reference to FIG. 3. The second thin-film transistor TFT2 of FIG. 4 may define (e.g., may include or may be) any suitable one from among the third transistor T3 and the fourth transistor T4 described above with reference to FIG. 3.

The substrate 100 may include a glass material, a ceramic material, a metal material, a flexible or bendable material, and/or the like. When the substrate 100 is flexible or bendable, the substrate 100 may include a polymer resin, for example, such as polyethersulfone, polyarylate, polyetherimide, polyethylene naphthalate, polyethylene terephthalate, polyphenylene sulfide, polyimide, polycarbonate, and/or cellulose acetate propionate. The substrate 100 may have a single layer structure or a multi-layered structure including one or more of the materials described above. When the substrate 100 has a multi-layered structure, the substrate 100 may further include an inorganic layer. For example, in some embodiments, the substrate 100 may have a stacked structure including an organic material, an inorganic material, and an organic material that are stacked (e.g., sequentially stacked) on each other, or a stacked structure including an organic material, an inorganic material, an organic material, and an inorganic material that are stacked (e.g., sequentially stacked) on each other.

The buffer layer 110 may improve smoothness of (e.g., or provide a smooth surface to) a top surface of the substrate 100. The buffer layer 110 may include an inorganic insulating material, for example, such as silicon oxide, silicon nitride, and/or silicon oxynitride.

A first semiconductor layer AS of the first thin-film transistor TFT1 may be disposed on the buffer layer 110. The first semiconductor layer AS may include a silicon semiconductor. The first semiconductor layer AS may include a source area S1, a drain area D1 spaced apart from the source area S1, and a channel area C1 between the source area S1 and the drain area D1. The source area S1 and the drain area D1 may have an impurity doped therein to have a conductivity. The source area S1 and the drain area D1 may correspond to a source electrode and a drain electrode of the first thin-film transistor TFT1, respectively. In another embodiment, positions of the source area S1 and the drain area D1 may be changed (e.g., switched) with each other.

A gate electrode GE1 of the first thin-film transistor TFT1 may be disposed on the first semiconductor layer AS, and a first insulating layer 111 may be disposed between the first semiconductor layer AS and the gate electrode GE1. The first insulating layer 111 may include an inorganic material including an oxide or a nitride. For example, the first insulating layer 111 may include silicon oxide, silicon nitride, silicon oxynitride, aluminum oxide, titanium oxide, tantalum oxide, and/or hafnium oxide.

The gate electrode GE1 of the first thin-film transistor TFT1 may overlap with the channel area C1 of the first semiconductor layer AS. The gate electrode GE1 may include molybdenum (Mo), copper (Cu), and/or titanium (Ti), and may have a single layer structure or a multi-layered structure including one or more of the materials described above.

The first electrode CE1 of the first capacitor Cst and the third electrode CE3 of the second capacitor Cbt may be disposed at (e.g., on) the same or substantially the same layer as that of the gate electrode GE1 of the first thin-film transistor TFT1. The first electrode CE1 of the first capacitor Cst and the third electrode CE3 of the second capacitor Cbt may include the same or substantially the same material as that of the gate electrode GE1 of the first thin-film transistor TFT1.

A second insulating layer 112 may be disposed on the gate electrode GE1 of the first thin-film transistor TFT1, the first electrode CE1 of the first capacitor Cst, and the third electrode CE3 of the second capacitor Cbt. The second insulating layer 112 may include an inorganic material including an oxide or a nitride. For example, the second insulating layer 112 may include silicon oxide, silicon nitride, silicon oxynitride, aluminum oxide, titanium oxide, tantalum oxide, and/or hafnium oxide.

The second electrode CE2 of the first capacitor Cst may be disposed on the second insulating layer 112 to overlap with the first electrode CE1 of the first capacitor Cst. The second electrode CE2 may include, for example, Mo, Cu, and/or Ti, and may have a single layer structure or a multi-layered structure including one or more of the materials described above.

A third insulating layer 113 may be disposed on the second electrode CE2 of the first capacitor Cst. The third insulating layer 113 may include an inorganic material including an oxide or a nitride. For example, the third insulating layer 113 may include silicon oxide, silicon nitride, silicon oxynitride, aluminum oxide, titanium oxide, tantalum oxide, and/or hafnium oxide.

In FIG. 4, the first capacitor Cst is shown as being spaced apart (e.g., along a surface of the substrate 100) from the first thin-film transistor TFT1. However the present disclosure is not limited thereto, and in another embodiment, the first capacitor Cst may overlap with the first thin-film transistor TFT1. For example, when the first thin-film transistor TFT1 defines (or is) a driving transistor (for example, the first transistor T1) described above with reference to FIG. 3, the second electrode CE2 of the first capacitor Cst may be disposed on the gate electrode GE1 of the first thin-film transistor TFT1, and may overlap with the gate electrode GE1. In this case, the gate electrode GE1 of the first thin-film transistor TFT1 may function as both the gate electrode of the first thin-film transistor TFT1 and as the first electrode CE1 of the first capacitor Cst.

A second semiconductor layer AO of the second thin-film transistor TFT2 may be disposed on the third insulating layer 113. The second semiconductor layer AO may include an oxide semiconductor. The second semiconductor layer AO may include a source area S2, a drain area D2 spaced apart from the source area S2, and a channel area C2 between the source area S2 and the drain area D2. The oxide semiconductor may include, for example, zinc (Zn) oxide, indium (In)—Zn oxide, gallium (Ga)—In—Zn oxide, and/or the like, which are Zn oxide-based materials. For example, the second semiconductor layer AO may include, for example, an In—Ga—Zn—O (IGZO) semiconductor, an In-tin (Sn)—Zn—O (ITZO) semiconductor, and/or an In—Ga—Sn—Zn—O (IGTZO) semiconductor, which may be formed by combining (or adding) various suitable metals, for example, such as In, Ga, and/or Sn to ZnO. Each of the source area S2 and the drain area D2 may have a conductivity. The source area S2 and the drain area D2 of the second semiconductor layer AO may be formed by controlling a carrier concentration of the oxide semiconductor, and making the oxide semiconductor conductive. For example, the source area S2 and the drain area D2 may be formed by increasing the carrier concentration through a plasma treatment that is performed on the oxide semiconductor by using a hydrogen (H)-based gas, a fluorine (F)-based gas, or a combination thereof.

The second thin-film transistor TFT2 may include a double gate electrode. For example, a first gate electrode GEa may be disposed below (e.g., to overlap with) the second semiconductor layer AO of the second thin-film transistor TFT2, and a second gate electrode GEb may be disposed above (e.g., on) the second semiconductor layer AO of the second thin-film transistor TFT2. The third insulating layer 113 may be disposed between the first gate electrode GEa and the second semiconductor layer AO of the second thin-film transistor TFT2. The first gate electrode GEa of the second thin-film transistor TFT2 may be positioned at (e.g., on) the same or substantially the same layer as that of the second electrode CE2 of the first capacitor Cst, and may be formed using the same or substantially the same material as that of the second electrode CE2 of the first capacitor Cst. The first gate electrode GEa may overlap with the channel area C2 of the second semiconductor layer AO.

A fourth insulating layer 114 may be disposed between the second semiconductor layer AO and the second gate electrode GEb of the second thin-film transistor TFT2. The second gate electrode GEb may overlap with the channel area C2 of the second semiconductor layer AO. The fourth insulating layer 114 may be formed using the same or substantially the same mask process (e.g., using the same mask) as that of the second gate electrode GEb. In this case, the fourth insulating layer 114 may be formed to have the same or substantially the same shape as that of the second gate electrode GEb.

The fourth insulating layer 114 may include an inorganic material including an oxide or a nitride. For example, the fourth insulating layer 114 may include silicon oxide, silicon nitride, silicon oxynitride, aluminum oxide, titanium oxide, tantalum oxide, and/or hafnium oxide. The second gate electrode GEb may include, for example, Mo, Cu, and/or Ti, and may have a single layer structure or a multi-layered structure including one or more of the materials described above.

A fourth electrode CE4 of the second capacitor Cbt may be disposed on the third insulating layer 113, and may overlap with the third electrode CE3. The fourth electrode CE4 of the second capacitor Cbt may include an oxide semiconductor. In an embodiment, the fourth electrode CE4 of the second capacitor Cbt may extend from the second semiconductor layer AO of the second thin-film transistor TFT2, and may overlap with the third electrode CE3. The second insulating layer 112 and the third insulating layer 113 may be disposed between the third electrode CE3 and the fourth electrode CE4.

A fifth insulating layer 115 may cover the second thin-film transistor TFT2. The fifth insulating layer 115 may be disposed above (e.g., on) the second gate electrode GEb, and the power voltage line PL and a first connection electrode 167 may be disposed on the fifth insulating layer 115.

The fifth insulating layer 115 may include an inorganic material including an oxide or a nitride. For example, the fifth insulating layer 115 may include silicon oxide, silicon nitride, silicon oxynitride, aluminum oxide, titanium oxide, tantalum oxide, and/or hafnium oxide.

The power voltage line PL and the first connection electrode 167 may include one or more materials having a comparatively high conductivity. The power voltage line PL and the first connection electrode 167 may include, for example, Al, Cu, and/or Ti, and may have a single layer structure or a multi-layered structure including one or more of the materials described above. For example, in some embodiments, each of the power voltage line PL and the first connection electrode 167 may have a stacked structure including triple layers of Ti, Al, and Ti, which may be stacked (e.g., sequentially disposed) on each other.

The first connection electrode 167 may be connected to the first semiconductor layer AS via a contact hole H1. The contact hole H1 may extend (e.g., pass) through the first insulating layer 111, the second insulating layer 112, the third insulating layer 113, and the fifth insulating layer 115, and may expose a part (or a portion) of the first semiconductor layer AS. A part (or a portion) of the first connection electrode 167 may be electrically connected to the first semiconductor layer AS via the contact hole H1.

A sixth insulating layer 116 may be a planarization layer, and may be disposed on the power voltage line PL and the first connection electrode 167. In an embodiment, the sixth insulating layer 116 may include an organic material, for example, such as acryl, benzocyclobutene (BCB), polyimide, and/or hexamethyldisiloxane (HMDSO). In another embodiment, the sixth insulating layer 116 may include an inorganic material. The sixth insulating layer 116 may function as a protective layer by covering the first thin-film transistor TFT1 and the second thin-film transistor TFT2, and an upper portion of the sixth insulating layer 116 may be flat. For example, the sixth insulating layer 116 may have a flat upper surface. The sixth insulating layer 116 may have a single layer structure or a multi-layered structure.

The data lines DL and a second connection electrode 177 may be disposed on the sixth insulating layer 116. A part (or a portion) of the data lines DL may overlap with the power voltage line PL. In other words, the data line DL may partially overlap with the power voltage line PL. The second connection electrode 177 may be connected to the first connection electrode 167 via a contact hole H2 defined in the sixth insulating layer 116. In other words, the contact hole H2 may extend (e.g., pass) through the sixth insulating layer 116 such that the second connection electrode 177 may be connected to the first connection electrode 167. The data lines DL and the second connection electrode 177 may include conductive materials, for example, such as a metal and/or a conductive oxide. For example, each of the data lines DL and the second connection electrode 177 may include Al, Cu, and/or Ti, and may have a single layer structure or a multi-layered structure including one or more of the materials described above. In an embodiment, each of the data lines DL and the second connection electrode 177 may have a stacked structure including triple layers of Ti, Al, and Ti, which may be stacked (e.g., sequentially disposed) on each other. A seventh insulating layer 117 may be disposed above (e.g., on) the data lines DL and the second connection electrode 177.

An organic light-emitting diode OLED may be disposed on the seventh insulating layer 117. The organic light-emitting diode OLED may include a pixel electrode 310, an opposite electrode 330, and an intermediate layer 320 interposed between the pixel electrode 310 and the opposite electrode 330. The intermediate layer 320 may include an emission layer.

The pixel electrode 310 may be connected to the second connection electrode 177 via a contact hole H3 that is defined at (e.g., in or on) the seventh insulating layer 117. In other words, the contact hole H3 may extend (e.g., pass) through the seventh insulating layer 117 such that the pixel electrode 310 may be connected to the second connection electrode 177. The pixel electrode 310 may be connected to the first thin-film transistor TFT1 via each of the second connection electrode 177 and the first connection electrode 167.

An eighth insulating layer 118 may be disposed above (e.g., on) the seventh insulating layer 117. The eighth insulating layer 118 may be a pixel-defining layer, and may have an opening corresponding to each pixel (e.g., an opening OP that overlaps a part or a portion of the pixel electrode 310 and exposes a part or a portion of the pixel electrode 310), thereby defining an emission area of the pixel (e.g., of each pixel) PX. Also, the eighth insulating layer 118 may increase a distance between an end (e.g., edge) of the pixel electrode 310 and an end (e.g., edge) of the opposite electrode 330, which is above (e.g., on) the pixel electrode 310, thereby preventing or substantially preventing an arc from occurring at (e.g., in or on) the edge of the pixel electrode 310. The eighth insulating layer 118 may include an inorganic material, such as, for example, a polyimide and/or HMDSO.

The pixel electrode 310 may be disposed on the seventh insulating layer 117, and may include a conductive oxide, for example, such as indium tin oxide (ITO), indium zinc oxide (IZO), zinc oxide (ZnO), indium oxide ($In_2O_3$), indium gallium oxide (IGO), and/or aluminum zinc oxide (AZO). In another embodiment, the pixel electrode 310 may include a reflective layer including, for example, silver (Ag), magnesium (Mg), Al, platinum (Pt), palladium (Pd), gold (Au), nickel (Ni), neodymium (Nd), iridium (Ir), chromium (Cr), or a suitable compound thereof. In another embodiment, the pixel electrode 310 may further include a layer that is on the reflective layer described above and/or under the reflective layer, and the layer may include, for example, ITO, IZO, ZnO, and/or $In_2O_3$.

The intermediate layer 320 of the organic light-emitting diode OLED includes the emission layer. The emission layer may include a polymer or a small molecular weight organic material that emits light having a desired (e.g., a certain) color. For example, in an embodiment, the emission layer may include a red emission layer, a green emission layer, or a blue emission layer. In another embodiment, the emission layer may have a multi-layered structure in which a red emission layer, a green emission layer, and a blue emission layer are stacked on each other so as to emit white light, or a single layer structure including a red emission material, a green emission material, and a blue emission material. In an embodiment, the intermediate layer 320 may include a first functional layer below the emission layer and/or a second functional layer above the emission layer. Each of the first functional layer and/or the second functional layer may be formed as a one body (e.g., unitarily formed or commonly formed) so as to cover a plurality of pixel electrodes 310, or may each be patterned to correspond to each of the plurality of pixel electrodes 310.

The first functional layer may have a single layer structure or a multi-layered structure. For example, when the first functional layer includes a polymer material, the first functional layer may include (or may be) a hole transport layer (HTL) having a single layer structure including, for example, poly-(3,4)-ethylene-dihydroxy thiophene (PEDOT) or polyaniline (PANI). In another example, when the first functional layer includes a small molecular material, the first functional layer may include a hole injection layer (HIL) and the HTL.

The second functional layer may be optionally (or selectively) provided. For example, when the first functional layer and the emission layer include polymer materials, the second functional layer may be formed so that the organic light-emitting diode OLED has improved (e.g., excellent) characteristics. The second functional layer may have a single layer structure or a multi-layered structure. The second functional layer may include an electron transport layer (ETL) and/or an electron injection layer (EIL).

The opposite electrode 330 may be disposed to face the pixel electrode 310 with the intermediate layer 320 therebetween. The opposite electrode 330 may include a conductive material having a small work function. For example, in an embodiment, the opposite electrode 330 may include a transparent or semi-transparent layer including, for example, Ag, Mg, Al, Pt, Pd, Au, Ni, Nd, Ir, Cr, Li, calcium (Ca), or a suitable alloy thereof. In another embodiment, the opposite electrode 330 may further include a layer, for example, such as ITO, IZO, ZnO, or $In_2O_3$, which is on the transparent or semi-transparent layer including one or more of the materials described above. The opposite electrode 330 may be positioned above (e.g., on) the intermediate layer 320 and the eighth insulating layer 118. The opposite electrode 330 may include a common electrode that is formed as one body in (e.g., that is commonly formed for) the plurality of organic light-emitting diodes OLED at (e.g., in or on) the display area DA, and faces the plurality of pixel electrodes 310.

A thin-film encapsulation layer or a sealing substrate may be disposed above (e.g., on) the organic light-emitting diode OLED to cover and protect the organic light-emitting diode OLED. The thin-film encapsulation layer may cover the display area DA, and may extend to an outside of the display area DA. The thin-film encapsulation layer may include an inorganic encapsulation layer including at least one inorganic material, and an organic encapsulation layer including at least one organic material. In some embodiments, the thin-film encapsulation layer may include a structure in which a first inorganic encapsulation layer, an organic encapsulation layer, and a second inorganic encapsulation layer are stacked (e.g., sequentially stacked) on each other. The sealing substrate may face the substrate 100 and may be connected to (e.g., attached to or adhered to) the substrate 100 outside the display area DA using a sealing member, for example, such as a sealant and/or a frit.

A spacer for preventing or substantially preventing a mask from being stamped may be further disposed on the eighth insulating layer 118. Various suitable functional layers, for example, such as a polarization layer for reducing external light reflection, a black matrix, a color filter, and/or a touch screen layer having a touch electrode, may be provided on the thin-film encapsulation layer as would be known to those skilled in the art.

Figure 5A:
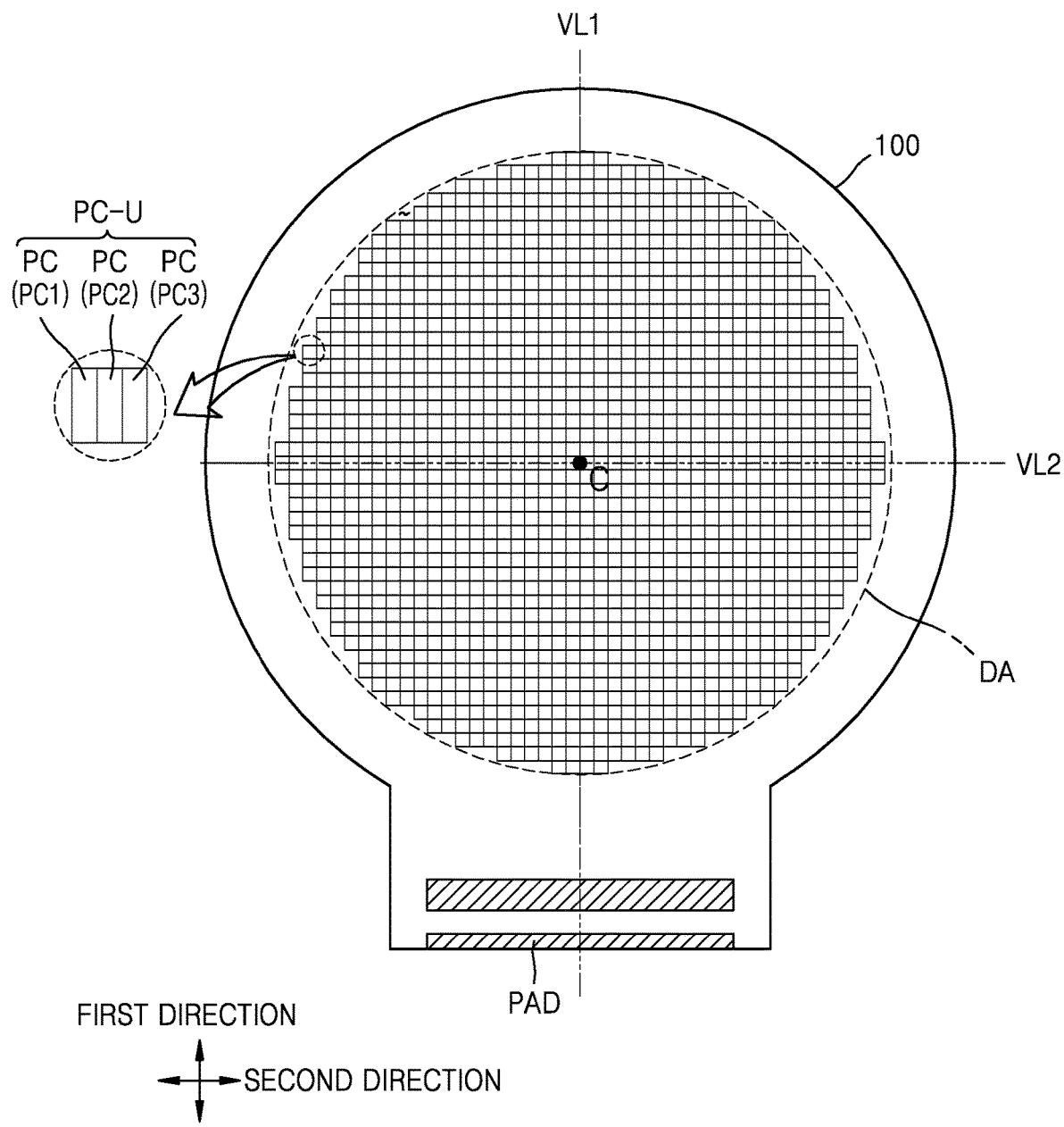
FIG. 5A is a plan view schematically illustrating an arrangement of pixel circuits included in the pixels of a display apparatus according to an embodiment.
Figure 5B:
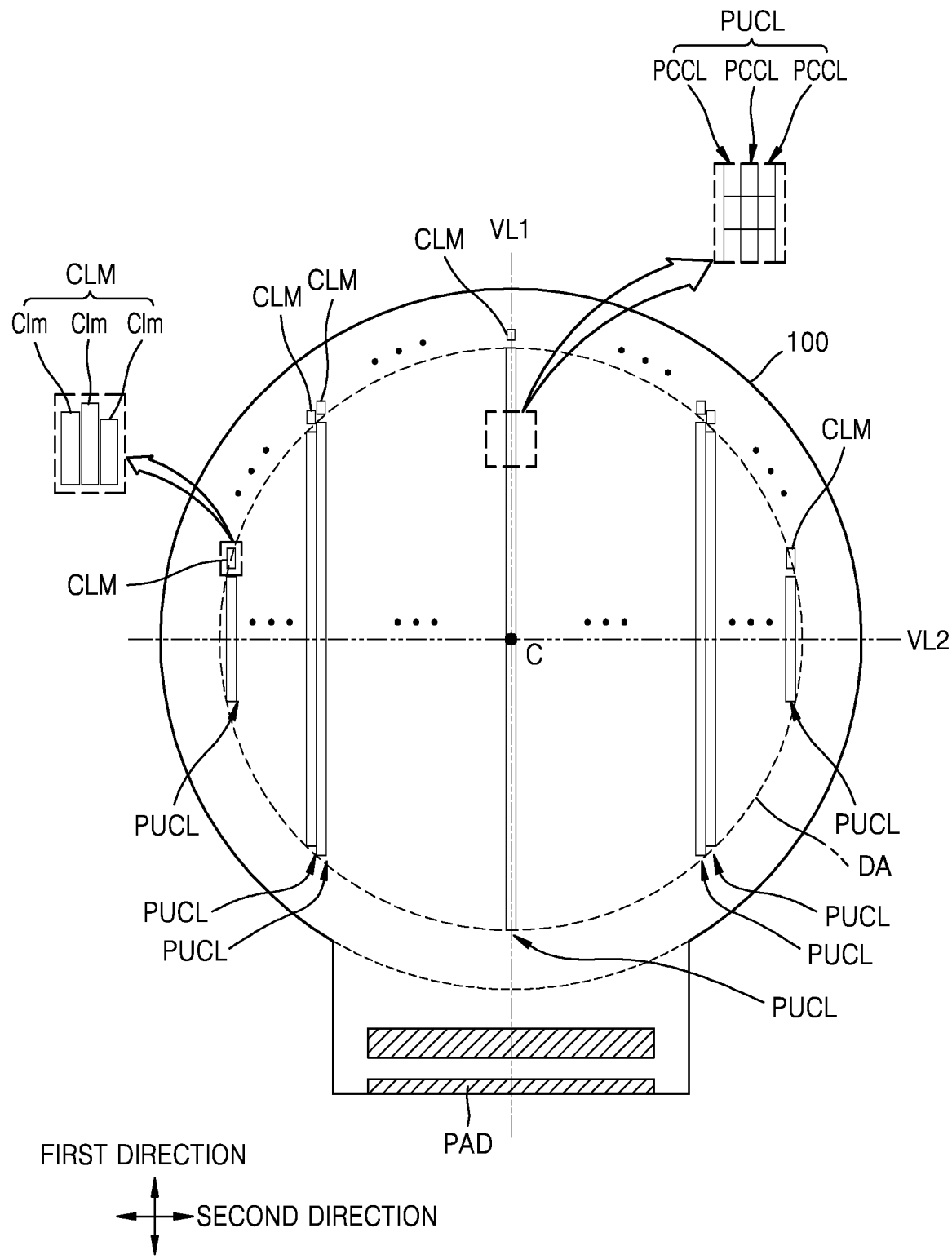
FIG. 5B is a plan view illustrating the pixel circuits and a load compensation capacitor of a display apparatus according to an embodiment.

FIG. 5A is a plan view schematically illustrating an arrangement of pixel circuits included in the pixels of a display apparatus according to an embodiment, and FIG. 5B is a plan view illustrating the pixel circuits and a load compensation capacitor of a display apparatus according to an embodiment.

A plurality of pixels are arranged on the substrate 100. The plurality of pixels may define a surface for displaying an image (e.g., an image surface) having a non-quadrangular shape. An image displayed by light emitted from a plurality of organic light-emitting display devices provided in the pixels (e.g., in each of the pixels) at (e.g., in or on) the display area DA may be displayed on a side of the display apparatus corresponding to the image surface having the non-quadrangular shape, for example, a circular image side.

Each of the pixels at (e.g., in or on) the display area DA may include an organic light-emitting diode. Each of the organic light-emitting diodes may be electrically connected to a corresponding one of the pixel circuits PC, as described above with reference to FIG. 3. The pixel circuits PC may be disposed at (e.g., in or on) the display area DA, like the organic light-emitting diodes. For example, a plurality of pixel circuits PC may be provided in each pixel, and may be repeatedly arranged along a first direction and a second direction.

Because the display area DA has a non-quadrangular shape, the plurality of pixel circuits PC may have a stepwise configuration along ends (e.g., edges or an edge) of the display area DA. In this regard, FIG. 5A illustrates a structure in which the plurality of pixel circuits PC are arranged in a stepwise manner. As shown in FIG. 5A, one square box may represent a pixel circuit group PC-U, and one pixel circuit group PC-U may include a plurality of pixel circuits (e.g., three pixel circuits) PC. For convenience, FIG. 5A illustrates that one pixel circuit group PC-U corresponds to three pixel circuits PC. However, in another embodiment, there may be various suitable modifications, for example, wherein one pixel circuit group PC-U corresponds to less than three pixel circuits PC (e.g., two pixel circuits PC or one pixel circuit PC), or wherein one pixel circuit group PC-U corresponds to more than three pixel circuits PC (e.g., four pixel circuits PC). Hereinafter, a case where one pixel circuit group PC-U includes three pixel circuits PC, will be described for convenience. Further, for convenience, the three pixel circuits PC may be referred to as including a first pixel circuit PC1, a second pixel circuit PC2, and a third pixel circuit PC3.

A plurality of pixel circuit groups PC-U may be arranged on the substrate 100, and may form a column in the first direction. Similarly, the pixel circuits PC may be arranged on the substrate 100, and may form a column in the first direction. For example, the plurality of pixel circuit groups PC-U that are arranged along the first direction may form one column (which hereinafter, may be referred to as a column of a circuit group) PUCL, as shown in FIG. 5B. When the pixel circuit group PC-U includes three pixel circuits PC as described above (e.g., and as shown in an enlarged portion view of FIG. 5A), the column of a circuit group PUCL may include three columns PCCLs of pixel circuits PC (a column PCCL of pixel circuits PC of which may be referred to hereinafter as a pixel circuit column PCCL) that extend in the first direction and are arranged with each other along the second direction. Accordingly, a plurality of pixel circuit columns PCCLs may be arranged at (e.g., in or on) the display area DA.

Because the display area DA has a non-quadrangular shape, lengths of the pixel circuit columns PCCLs at (e.g., in or on) the display area DA may be different from each other (e.g., from one another). For example, the number of pixel circuits PC in a pixel circuit column PCCL (e.g., an adjacent pixel circuit column PCCL) that is adjacent to the first virtual line VL1 that extends (e.g., that passes) through (e.g., across) the center C of the display area DA may be greater than the number of pixel circuits PC in another pixel circuit column PCCL that is farther away from the first virtual line VL1 in the second direction than the adjacent pixel circuit column PCCL.

In a comparative example, when pixel circuits are arranged at (e.g., in or on) a display area having a quadrangular shape (e.g., a simple quadrangular shape), the number of pixel circuits in the pixel circuit columns may be constant (e.g., may be equal or substantially equal to each other), and lengths of lines for providing signals or voltages to the corresponding pixel circuits may be constant (e.g., may be equal or substantially equal to each other). Thus, a load that is applied to each pixel circuit column may be constant (e.g., may be equal or substantially equal to each other). However, as shown in FIGS. 5A and 5B, the number of pixel circuits PC provided in at least some of the pixel circuit columns PCCL at (e.g., in or on) the non-quadrangular display area DA may be different from each other according to positions of the pixel circuit columns PCCL, and the lengths of at least some of the lines for providing signals or voltages to the pixel circuit columns PCCL may be different from each other. Thus, the load applied to each pixel circuit column PCCL may not be constant (e.g., may not be equal or substantially equal to each other). For example, the lengths of some of the data lines and/or the driving voltage lines that extend in respective pixel circuit columns PCCL may be different from each other according to the positions of the respective pixel circuit columns PCCL. Thus, the loads applied to the data lines and/or the driving voltage lines may not be constant (e.g., may not be equal or substantially equal to each other), and a load difference between the loads thereof may deteriorate the quality of an image. However, according to an embodiment of the present disclosure, as shown in FIG. 5B, a load matching portion CLM may be arranged at (e.g., in or on) each column of a circuit group PUCL. Accordingly, the problems described above may be prevented or substantially prevented from occurring. For example, the deterioration of the quality of the image from the load difference between the loads may be prevented or substantially prevented from occurring.

The load matching portion CLM may include one or more load compensation capacitors Clm, for example. As described above, each column of a circuit group PUCL may include three pixel circuit columns PCCLs. In this case, as shown in an enlarged portion view of FIG. 5B, the load matching portion CLM includes three load compensation capacitors Clm, each of the load compensation capacitors Clm corresponding to one of the pixel circuit columns PCCL of a corresponding column of the circuit group PUCL. The load compensation capacitors Clm may compensate for the load difference described above corresponding to each pixel circuit column PCCL.

The load matching portion CLM, or more particularly, the load compensation capacitors Clm, for example, may be positioned at a side of the second virtual line VL2 that is opposite to a side thereof at which the pad PAD is centered, the second virtual line VL2 extending (e.g., passing) through (e.g., across) the center C of the display area DA in the second direction.

Sizes and/or areas of the load compensation capacitors Clm of the load matching portion CLM may be different from each other (e.g., from one another) according to positions (e.g., locations) of the load compensation capacitors Clm and/or the load matching portion CLM. For example, the size and/or area of the load compensation capacitor Clm of the load matching portion CLM that corresponds to a column of a circuit group PUCL (e.g., an adjacent column of a circuit group PUCL) that is adjacent to the first virtual line VL1 may be less than the size and/or area of the load compensation capacitor Clm of the load matching portion CLM corresponding to a column of a circuit group PUCL that is farther away from the first virtual line VL1 in the second direction than the adjacent column of a circuit group PUCL. For example, a capacitance of the load compensation capacitor Clm that corresponds to a pixel circuit column PCCL (e.g., an adjacent pixel circuit column PCCL) that is adjacent to the first virtual line VL1 may be less than a capacitance of the load compensation capacitor Clm that corresponds to a pixel circuit column PCCL that is farther away from the first virtual line VL1 in the second direction than the adjacent pixel circuit column PCCL. Because the number of pixel circuits PC provided in the pixel circuit column PCCL may decrease as a distance between a corresponding column of a circuit group PUCL and the first virtual line VL1 increases, the size and/or area of the load compensation capacitor Clm of a corresponding load matching portion CLM may be increased as the distance between the corresponding column of a circuit group PUCL and the first virtual line VL1 increases.

Figure 6:
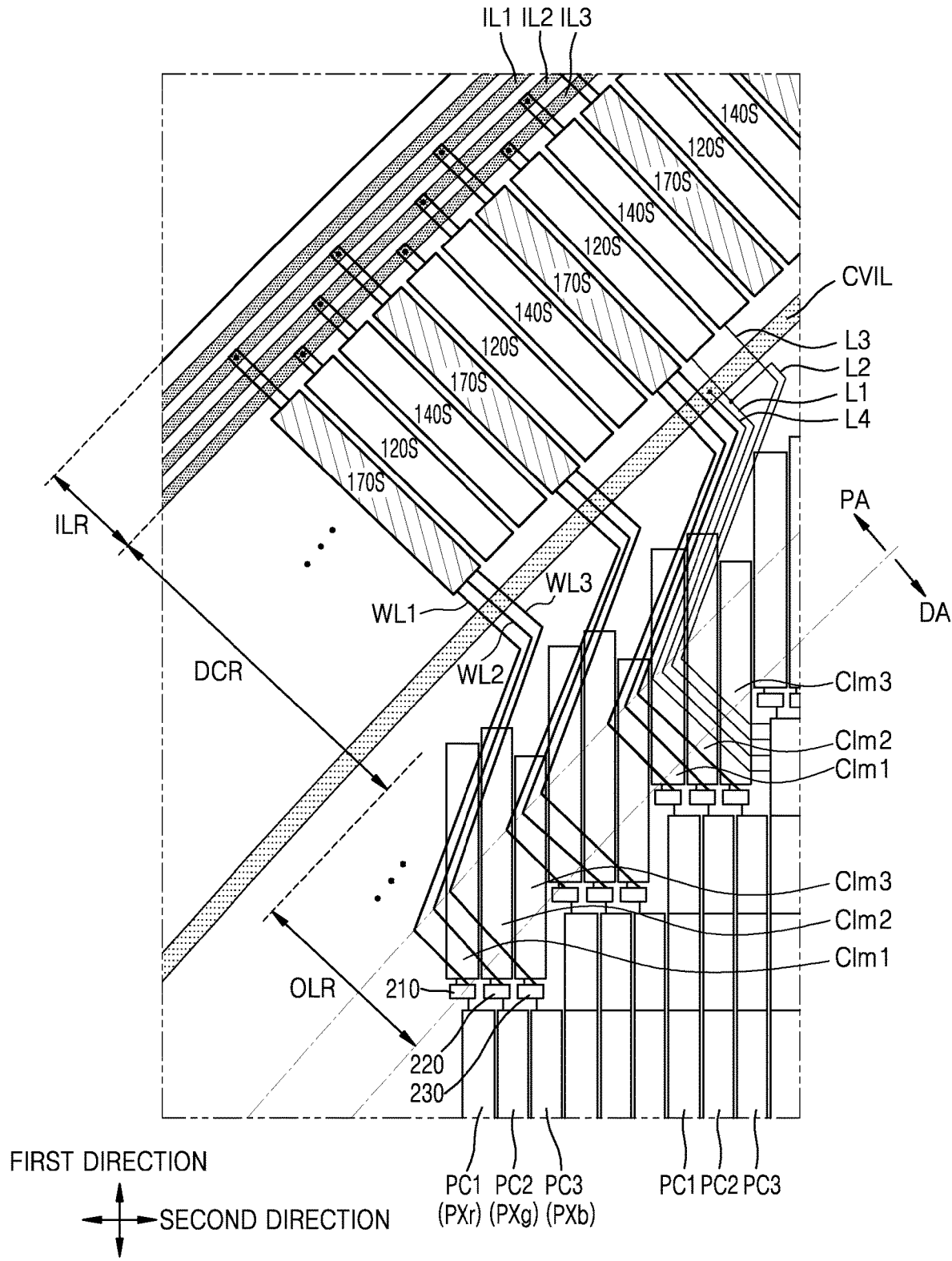
FIG. 6 is an enlarged plan view of a part of a display apparatus according to an embodiment.

FIG. 6 is an enlarged plan view of a part (or a portion) of a display apparatus according to an embodiment.

Referring to FIG. 6, the test circuit 170 (e.g., see FIG. 1) may include a plurality of sub-test circuits 170S, which may be sub-circuit portions of the test circuit 170. The sub-test circuits 170S may be arranged at (e.g., in or on) the outer area PA, and may be spaced apart from each other (e.g., from one another). One or more sub-circuit portions of a driving circuit may be arranged between adjacent ones of the sub-test circuits 170S. For example, FIG. 6 illustrates that a sub-emission control circuit 140S and a sub-first scan driving circuit 120S are disposed between the adjacent ones of the sub-test circuits 170S. In another embodiment, a sub-emission control circuit and a sub-second scan driving circuit may be disposed between the sub-test circuits 170S that are adjacent to each other (e.g., adjacent to one another) according to positions (e.g., locations) of the sub-test circuits 170S.

A first input line group IL1 may be connected to the sub-test circuit 170S, and may be disposed at (e.g., in or on) an input line region ILR that is located outside of a driving circuit region DCR. The first input line group IL1 may include one or more input signal lines. For example, in an embodiment, the first input line group IL1 may include a plurality of input signal lines for applying a control signal and a test signal to the sub-test circuit 170S.

Each sub-test circuit 170S may operate according to the control signal transmitted thereto via the first input line group IL1, and may output the test signal that is transmitted via the first input line group IL1 to a signal line (for example, the data lines) of a pixel circuit and to an electrode of the load compensation capacitor. In an embodiment, as shown in FIG. 6, each sub-test circuit 170S may output the test signal to corresponding signal lines of the first through third pixel circuits PC1, PC2, and PC3, and to corresponding electrodes of the first through third load compensation capacitors Clm1, Clm2, and Clm3 through first through third output lines WL1, WL2, and WL3. The first through third load compensation capacitors Clm1, Clm2, and Clm3 may be positioned to correspond to the first through third pixel circuits PC1, PC2, and PC3.

The sub-test circuit 170S may be electrically connected to a first connection portion 210 via the first output line WL1 at (e.g., in or on) an output line region OLR. The first connection portion 210 may be connected to the first load compensation capacitor Clm1 and to a data line DL of the first pixel circuit PC1 corresponding to a first pixel, for example, a red pixel PXr. Similarly, the sub-test circuit 170S may be electrically connected to a second connection portion 220 via the second output line WL2. The second connection portion 220 may be connected to a signal line (e.g., a data line) of the second pixel circuit PC2 of a second pixel, for example, a green pixel PXg, and to the second load compensation capacitor Clm2. The sub-test circuit 170S may be electrically connected to a third connection portion 230 via the third output line WL3. The third connection portion 230 may be connected to a signal line (e.g., a data line) of the third pixel circuit PC3 of a third pixel, for example, a blue pixel PXb, and to the third load compensation capacitor Clm3. Each of the first connection portion 210, the second connection portion 220, and the third connection portion 230 may be positioned between a respective pixel circuit from among the first through third pixel circuits PC1, PC2, and PC3 and a respective load compensation capacitor from among the first through third load compensation capacitors Clm2, Clm2, and Clm3.

A second input line group IL2 and a third input line group IL3 may be positioned at (e.g., in or on) the input line region ILR that is located outside of the driving circuit region DCR. The second input line group IL2 and the third input line group IL3 may be connected to the sub-emission control circuit 140S and the sub-first scan driving circuit 120S, respectively. The second input line group IL2 and the third input line group IL3 may include a plurality of voltage lines and a plurality of clock lines.

Each sub-first scan driving circuit 120S may output a scan signal to each pixel circuit PC via at least one line at (e.g., in or on) the output line region OLR. In an embodiment, FIG. 6 illustrates that the scan signal output from the sub-first scan driving circuit 120S is transmitted to a row of the first through third pixel circuits PC1, PC2, and PC3 in the second direction via two output lines, for example, first and second output lines L1 and L2 that are branched from each other. Each sub-emission control circuit 140S may output an emission control signal to each corresponding pixel circuit PC via the third output line L3 at (e.g., in or on) the output line region OLR.

A common initialization voltage line CVIL may be disposed at (e.g., in or on) the driving circuit region DCR. An initialization voltage provided by the common initialization voltage line CVIL may be provided to each pixel circuit PC via the fourth output line L4 at (e.g., in or on) the output line region OLR.

The lines at (e.g., in or on) the output line region OLR may have a bent shape at (e.g., in or on) the output line region OLR. For example, FIG. 6 illustrates that the first through third output lines WL1, WL2, and WL3 and the first through fourth output lines L1, L2, L3, and L4 may be bent at (e.g., in or on) the output line region OLR.

Figure 7A:
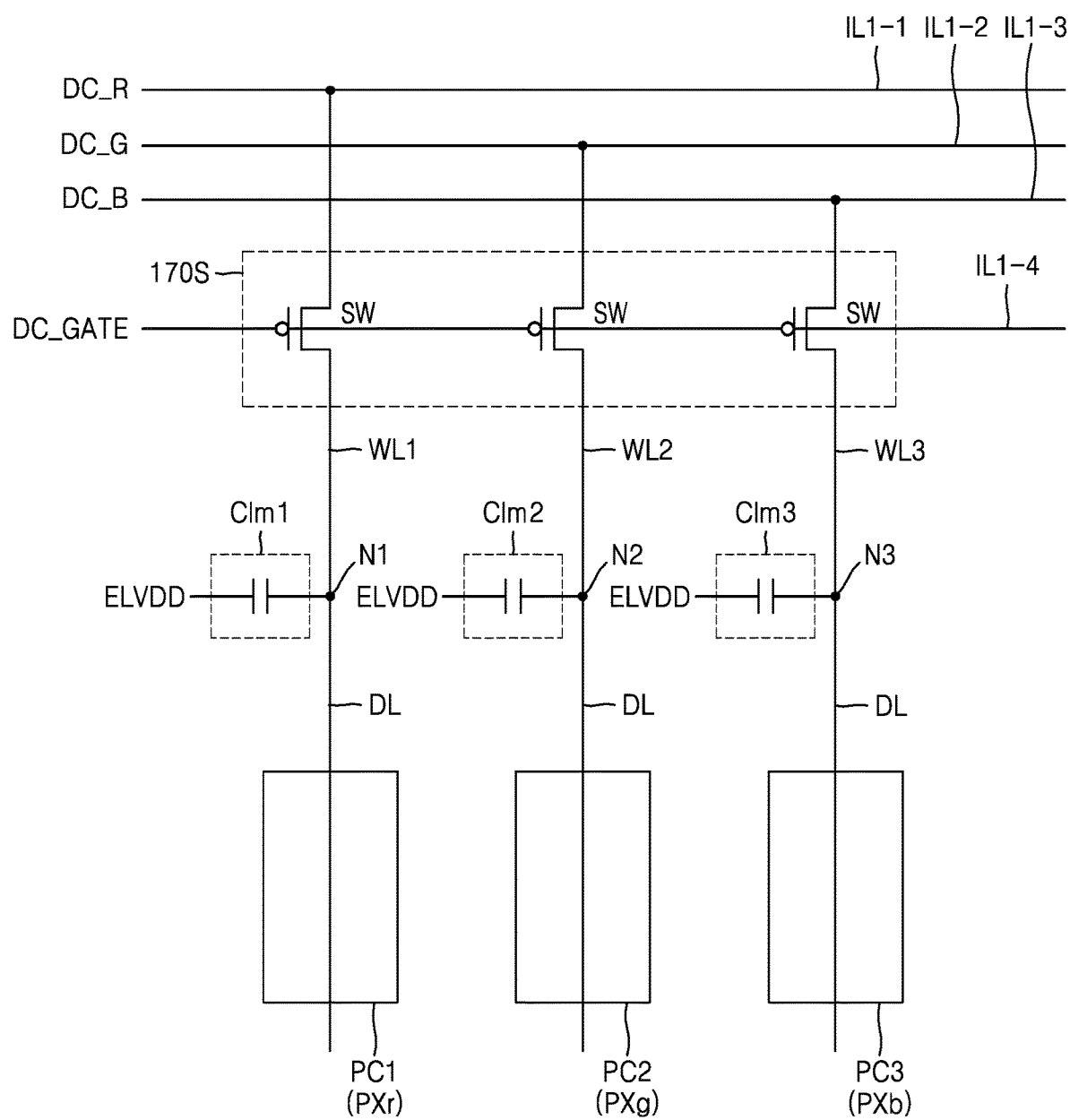
FIGS. 7A and 7B are circuit diagrams schematically illustrating a sub-test circuit according to one or more embodiments.
Figure 7B:
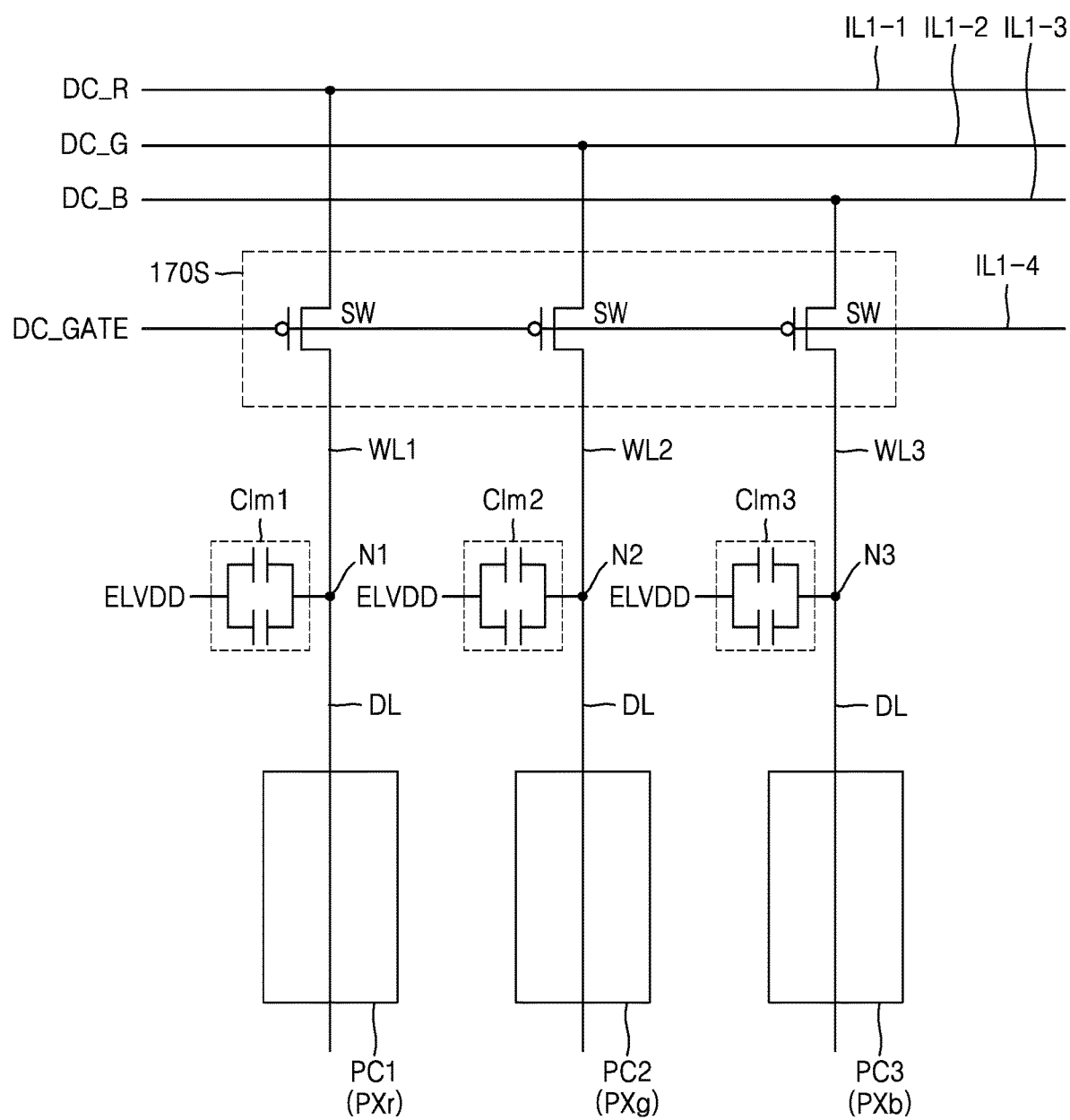

FIGS. 7A and 7B are circuit diagrams schematically illustrating electrical connections of one sub-test circuit, a pixel circuit, and a load compensation capacitor, which are provided in a display apparatus according to various embodiments.

Referring to FIGS. 6 and 7A, the sub-test circuit 170S may include a plurality of switches SW that operate according to a control signal DC_GATE that is transmitted via a fourth input signal line IL1-4 from among the first input line group IL1. Each of the switches SW may include a thin-film transistor.

Each switch SW may be turned on according to the control signal DC_GATE, and may provide a corresponding one of test signals DC_R, DC_G, and DC_B applied to the sub-test circuit 170S to a corresponding one of the data lines DL of a corresponding pixel circuit from among the first through third pixel circuits PC1, PC2, and PC3, and to an electrode of a corresponding load compensation capacitor from among the first through third load compensation capacitors Clm1, Clm2, and Clm3.

For example, a first switch SW of the sub-test circuit 170S may be turned on according to the control signal DC_GATE, and may output a test signal DC_R that is applied from a first input signal line IL1-1 via the first output line WL1 to a first node N1. The test signal DC_R may be provided to a corresponding data line DL of the first pixel circuit PC1 of the red pixel PXr, and to an electrode of the first load compensation capacitor Clm1. The corresponding data line DL and the electrode of the first load compensation capacitor Clm1 are connected to the first node N1. Similarly, a second switch SW of the sub-test circuit 170S may be turned on according to the control signal DC_GATE, and may output a test signal DC_G that is applied from the second input signal line IL1-2 via the second output line WL2 to a second node N2. The test signal DC_G may be provided to a corresponding data line DL of the second pixel circuit PC2 of the green pixel PXg, and to an electrode of the second load compensation capacitor Clm2 that are connected to the second node N2. A third switch SW of the sub-test circuit 170S may be turned on according to the control signal DC_GATE, and may output a test signal DC_B that is applied from the third input signal line IL1-3 via the third output line WL3 to a third node N3. The test signal DC_B may be provided to a corresponding data line DL of the third pixel circuit PC3 of the blue pixel PXb, and to an electrode of the third load compensation capacitor Clm3, each of which is connected to the third node N3.

Other electrodes (e.g., opposite electrodes) of the first through third load compensation capacitors Clm1, Clm2, and Clm3 that are not connected to the first to third node N1, N2, and N3 may have a level of (e.g., may be supplied with) a constant or substantially constant voltage, for example, a first power supply voltage ELVDD.

FIG. 7A illustrates that each of the first through third load compensation capacitors Clm1, Clm2, and Clm3 that is connected to a corresponding node (e.g., N1, N2, or N3) includes one capacitor. However, in another embodiment, at least one of the first through third load compensation capacitors Clm1, Clm2, and Clm3 may include a plurality of sub-capacitors connected in parallel with each other. For example, FIG. 7B illustrates that each of the first through third load compensation capacitors Clm1, Clm2, and Clm3 includes a plurality of sub-capacitors (e.g., two sub-capacitors) that are connected in parallel. When each of the first through third load compensation capacitors Clm1, Clm2, and Clm3 includes the plurality of sub-capacitors that are connected in parallel, even when the first through third load compensation capacitors Clm1, Clm2, and Clm3 are disposed at (e.g., in or on) a comparatively narrow area, sufficient capacitance may be attained. Thus, a load difference may be sufficiently compensated for, and the area (or size) of an outer area may be reduced.

In FIGS. 6, 7A, and 7B, one sub-test circuit 170S is described as including three switches SW, such that each switch SW is electrically connected to a respective one of the first pixel circuit PC1 corresponding to the red pixel PXr, the second pixel circuit PC2 corresponding to the green pixel PXg, or the third pixel circuit PC3 corresponding to the blue pixel PXb. In this case, a red pixel, a green pixel, and a blue pixel may constitute one unit (e.g., one pixel or one pixel unit). However, the disclosure is not limited thereto, for example, in another embodiment, the red and green pixels may constitute one unit (e.g., one pixel or one pixel unit), and the green and blue pixels may constitute another unit (e.g., another pixel or another pixel unit). In this case, each sub-test circuit 170S may include two switches or four switches according to a layout composition of the pixel circuits, as would be understood to those having skill in the art.

Figure 8:
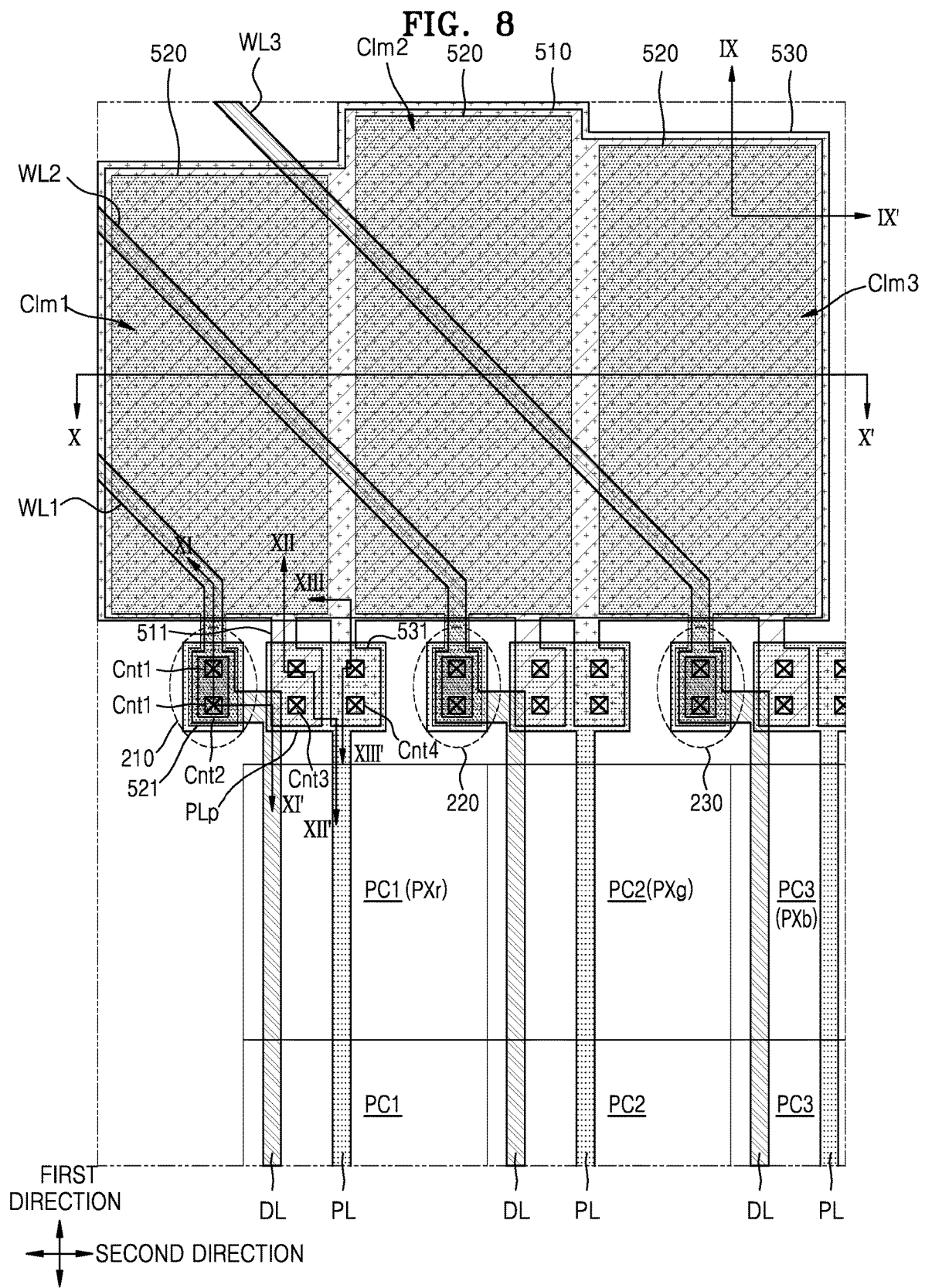
FIG. 8 is a plan view illustrating a part of a display apparatus according to an embodiment.
Figure 9:
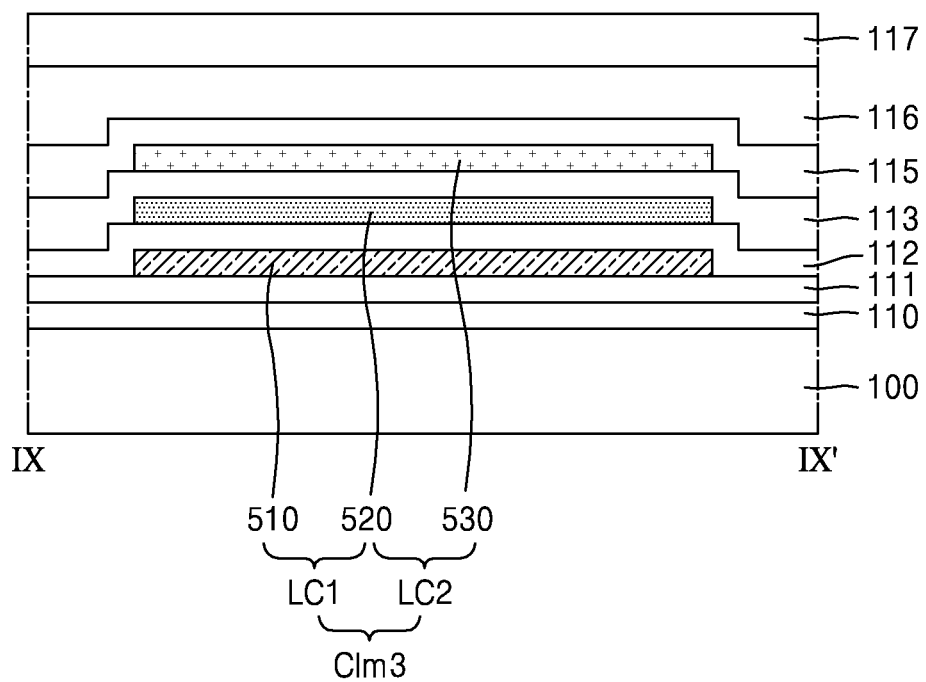
FIG. 9 is a cross-sectional view of the display apparatus taken along the line IX-IX' of FIG. 8.
Figure 10:
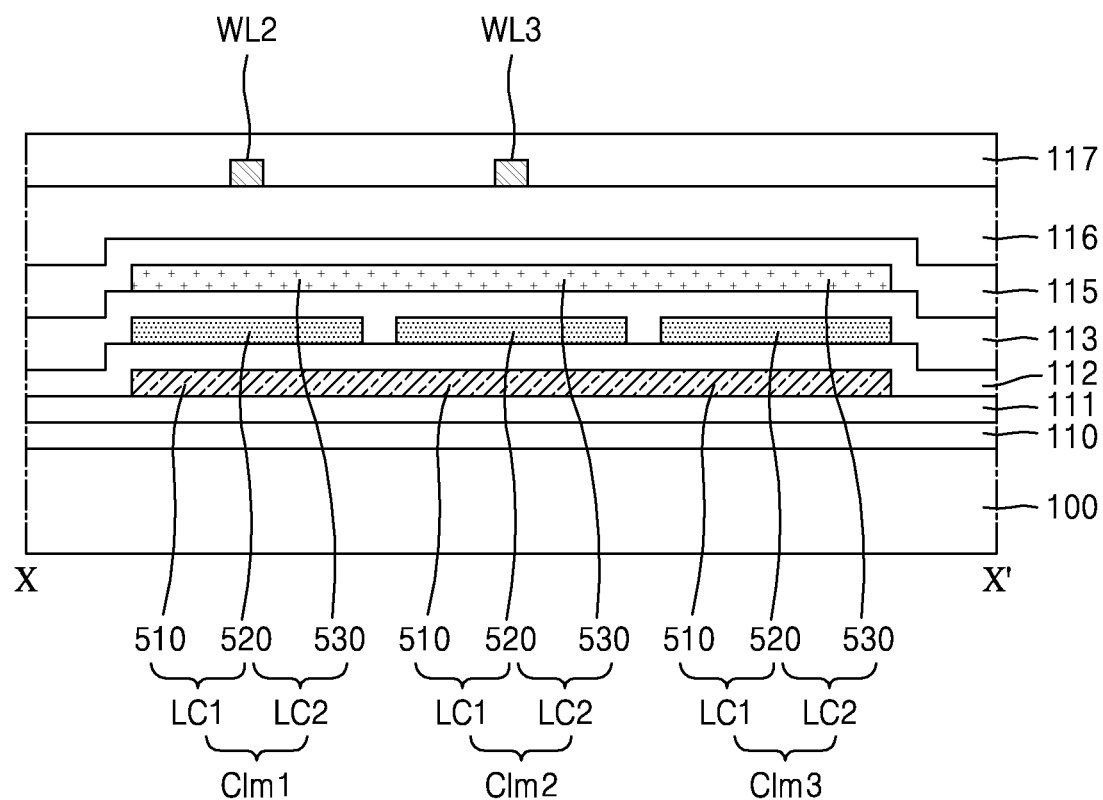
FIG. 10 is a cross-sectional view of the display apparatus taken along the line X-X' of FIG. 8.
Figure 11:
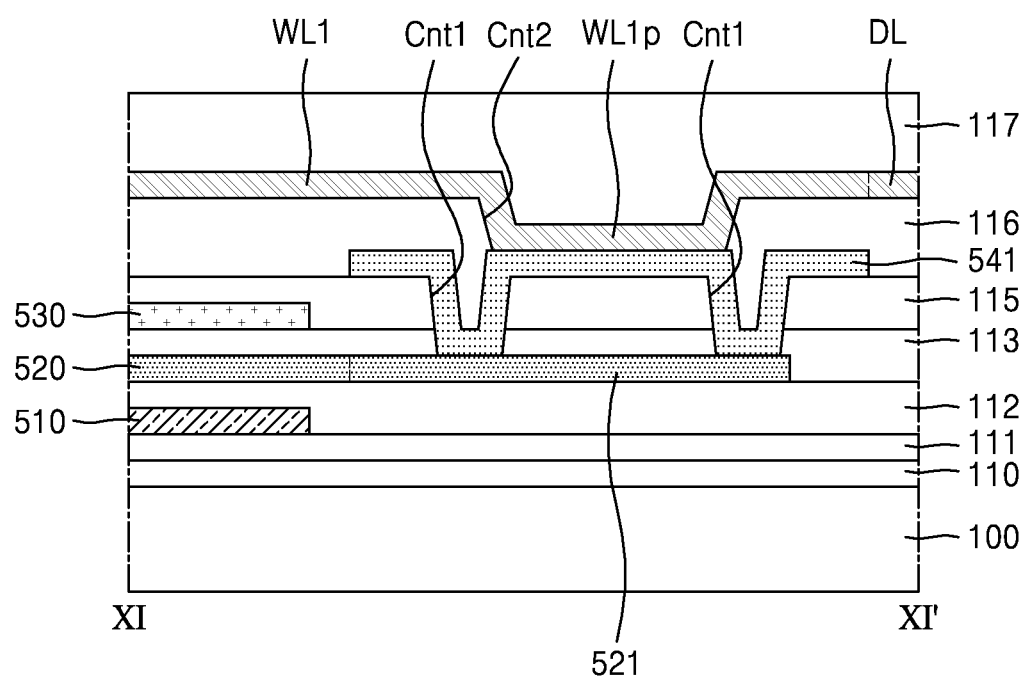
FIG. 11 is a cross-sectional view of the display apparatus taken along the line XI-XI' of FIG. 8.
Figure 12:
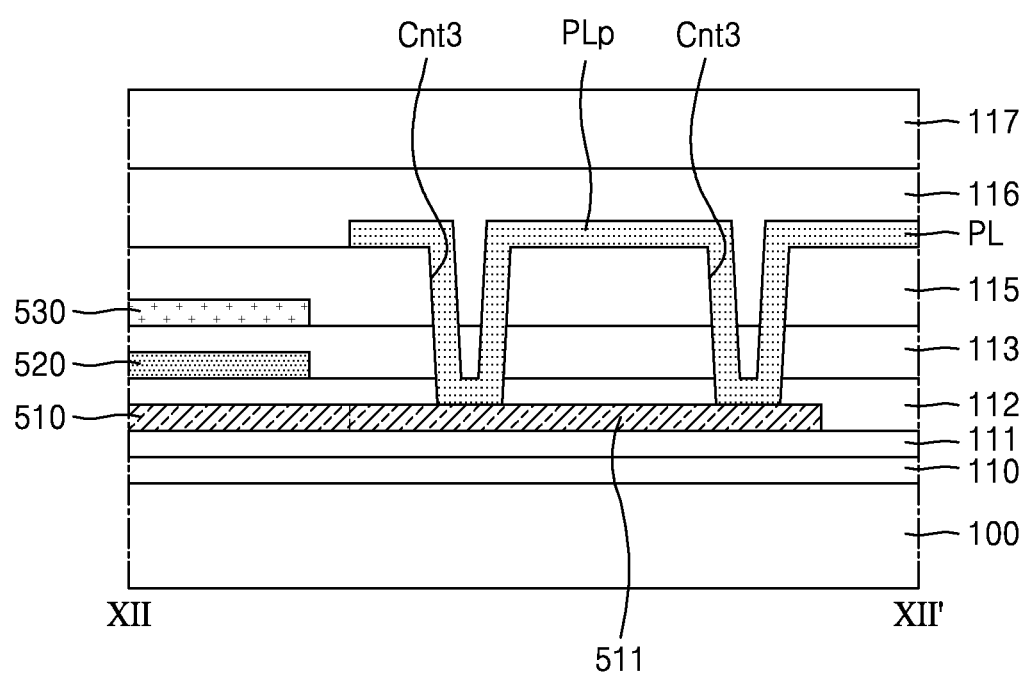
FIG. 12 is a cross-sectional view of the display apparatus taken along the line XII-XII' of FIG. 8.
Figure 13:
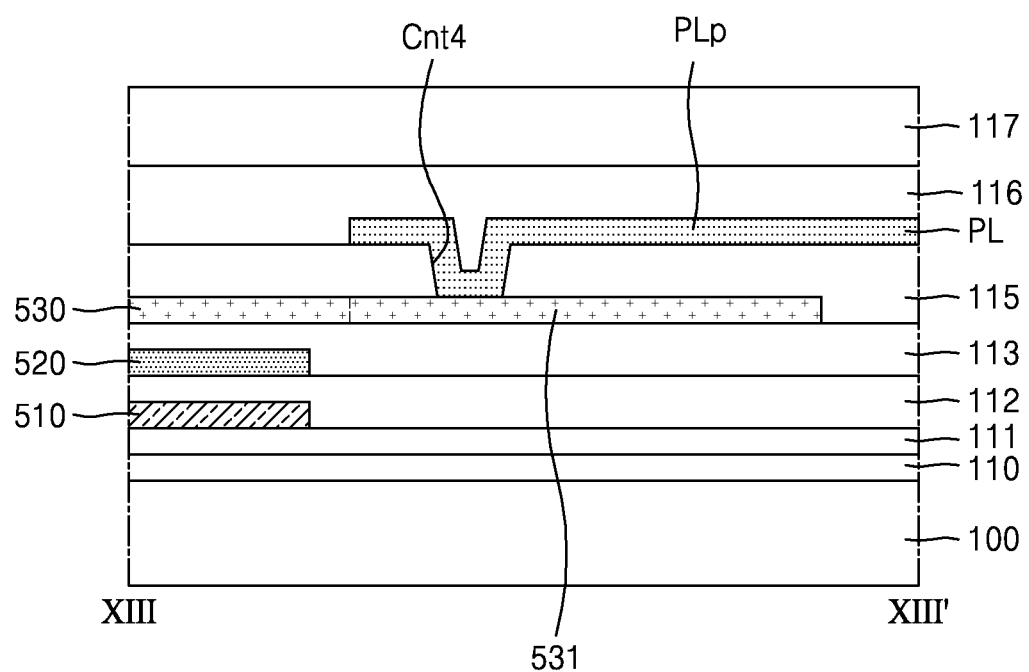
FIG. 13 is a cross-sectional view of the display apparatus taken along the line XIII-XIII' of FIG. 8.

FIG. 8 is a plan view illustrating a part of a display apparatus according to an embodiment, FIG. 9 is a cross-sectional view of the display apparatus taken along the line IX-IX' of FIG. 8, FIG. 10 is a cross-sectional view of the display apparatus taken along the line X-X' of FIG. 8, FIG. 11 is a cross-sectional view of the display apparatus taken along the line XI-XI' of FIG. 8, FIG. 12 is a cross-sectional view of the display apparatus taken along the line XII-XII' of FIG. 8, and FIG. 13 is a cross-sectional view of the display apparatus taken along the line XIII-XIII' of FIG. 8.

Referring to FIG. 8, first through third pixel circuits PC1, PC2, and PC3 corresponding to the first through third pixels, for example, a red pixel PXr, a green pixel PXg, and a blue pixel PXb, respectively, may be arranged with each other along the second direction. A plurality of the first pixel circuits PC1 may be arranged with each other along the first direction, and may each be connected to a data line DL and a power voltage line PL, which extend in the first direction. In other words, the data line DL may be electrically connected to the plurality of first pixel circuits PC1 that are arranged along the first direction. Similarly, the power voltage line PL may be electrically connected to each of the plurality of first pixel circuits PC1 that are arranged along the first direction. Similarly, a plurality of the second pixel circuits PC2 may be arranged with each other along the first direction, and may each be connected to a corresponding data line DL and a corresponding power voltage line PL. In addition, a plurality of the third pixel circuits PC3 may be arranged with each other along the first direction, and may be connected to a corresponding data line DL and a corresponding power voltage line PL. Further, the first through third pixel circuits PC1, PC2, and PC3 that are arranged with each other along the second direction may be connected to scan lines, an emission control line, and an initialization voltage line, which extend in the second direction as described above with reference to FIG. 6.

A load compensation capacitor may be disposed at one side of each data line DL, for example, at an upper side of each data line DL in FIG. 8. For example, a first load compensation capacitor Clm1 may be disposed at an upper side of the data line DL that extends (e.g., passes) through (e.g., across) the first pixel circuits PC1, a second load compensation capacitor Clm2 may be disposed at an upper side of the data line DL that extends (e.g., passes) through (e.g., across) the second pixel circuits PC2, and a third load compensation capacitor Clm3 may be disposed at an upper side of data line DL that extends (e.g., passes) through (e.g., across) the third pixel circuits PC3.

Each of the first through third load compensation capacitors Clm1, Clm2, and Clm3 may include at least two electrodes that overlap with each other. For example, in an embodiment, FIG. 9 illustrates that each of first through third load compensation capacitors Clm1, Clm2, and Clm3 includes three electrodes.

Referring to FIG. 9, a first electrode 510, a second electrode 520, and a third electrode 530, which are stacked (e.g., sequentially stacked) on each other, may be disposed on the substrate 100, and an insulating layer may be interposed between adjacent electrodes from among the first electrode 510, the second electrode 520, and the third electrode 530. For example, the first electrode 510 may be positioned on the buffer layer 110 and the first insulating layer 111, the second electrode 520 may be positioned on the second insulating layer 112, and the third electrode 530 may be positioned on the third insulating layer 113. The first insulating layer 111, the second insulating layer 112, and the third insulating layer 113 may include an inorganic material, for example, such as silicon oxide, silicon nitride, and/or silicon oxynitride. A fifth insulating layer 115, a sixth insulating layer 116, and a seventh insulating layer 117, which are stacked (e.g., sequentially stacked) on each other, may be disposed on the third electrode 530.

The first electrode 510 may include Mo, Cu, and/or Ti, and may have a single layer structure or a multi-layered structure including one or more of the materials described above. The first electrode 510 may be positioned at (e.g., on) the same layer as that of the gate electrode of the first thin-film transistor, the first electrode of the first capacitor, and/or the third electrode of the second capacitor, and may include the same or substantially the same material as one or more of the materials for forming the gate electrode of the first thin-film transistor, the first electrode of the first capacitor, and/or the third electrode of the second capacitor.

The second electrode 520 may include Mo, Cu, and/or Ti, and may have a single layer structure or a multi-layered structure. The second electrode 520 may be positioned at (e.g., on) the same layer as that of the first gate electrode of the second thin-film transistor and/or the second electrode of the first capacitor, as described above with reference to FIG. 4, and may include the same or substantially the same material as that of the first gate electrode of the second thin-film transistor and/or the second electrode of the first capacitor.

The third electrode 530 may include Mo, Cu, and/or Ti, and may have a single layer structure or a multi-layered structure including one or more of the materials described above. The third electrode 350 may be positioned on the same layer as that of the second gate electrode of the second thin-film transistor and/or a fourth electrode of the second capacitor, and may include the same or substantially the same material as one or more of the materials for forming the second gate electrode of the second thin-film transistor and/or the fourth electrode of the second capacitor, as described above with reference to FIG. 4.

The first electrode 510 and the second electrode 520 that overlap with each other with the second insulating layer 112 therebetween may define (e.g., may form) a first sub-capacitor LC1, and the second electrode 520 and the third electrode 530 that overlap with each other with the third insulating layer 113 therebetween may define (e.g., may form) a second sub-capacitor LC2. The load compensation capacitor may include the first sub-capacitor LC1 and the second sub-capacitor LC2, which are connected to each other in parallel. In this regard, FIG. 9 illustrates an example of the third load compensation capacitor Clm3.

In some embodiments, the first through third load compensation capacitors Clm1, Clm2, and Clm3 may share a part of one or more of the electrodes (e.g., the first to third electrodes 510, 520, and 530). For example, in an embodiment, referring to FIGS. 8 and 10, each of the first through third load compensation capacitors Clm1, Clm2, and Clm3 may include the first electrode 510, the second electrode 520, and the third electrode 530. The first and third electrodes 510 and 530 may be shared (e.g., may be unitary electrodes or may be electrically coupled as common electrodes). For example, unlike the plurality of second electrodes 520, which are spaced apart from each other (or from one another), the first electrode 510 may be formed as one body (e.g., as a unitary electrode or as a common electrode), while having an area corresponding to (e.g., having the same or substantially the same area as) those of the plurality of second electrodes 520 that are spaced apart from one another. Similarly, the third electrode 530 may be formed as one body (e.g., as a unitary electrode or as a common electrode), while having an area corresponding to (e.g., having the same or substantially the same area as) those of the plurality of second electrodes 520. In other words, each of the first electrodes 510 and the third electrodes 530 may have the area corresponding to a collective area of the three second electrodes 520.

Similar to the embodiment described above with reference to FIG. 9, each of the first through third load compensation capacitors Clm1, Clm2, and Clm3 in FIG. 10 may include the first and second sub-capacitors LC1 and LC2, which are connected to each other in parallel.

Referring back to FIG. 8, a connection portion may be disposed between a column of the pixel circuits and a load compensation capacitor. For example, as shown in FIG. 8, the first connection portion 210 may be positioned between a column of the first pixel circuits PC1 of the red pixels PXr and the first load compensation capacitor Clm1, which are adjacent to each other. The second connection portion 220 may be positioned between a column of the second pixel circuits PC2 of the green pixels PXg and the second load compensation capacitor Clm2, which are adjacent to each other. The third connection portion 230 may be positioned between a column of the third pixel circuits PC3 of the blue pixels PXb and the third load compensation capacitor Clm3, which are adjacent to each other.

The first connection portion 210 may have a connection structure in which the first output line WL1, the data line DL of the first pixel circuit PC1, and the second electrode 520 of the first load compensation capacitor Clm1 are electrically connected to each other (e.g., to one another). The first connection portion 210 may correspond to the first node N1 shown in FIGS. 7A and 7B. For example, the first connection portion 210 may have a structure in which one end portion of the first output line WL1, one end portion of the data line DL of the first pixel circuit PC1, and one end portion of the second electrode 520 of the first load compensation capacitor Clm1 are connected to each other (e.g., to one another).

Referring to FIGS. 8 and 11, the second electrode 520 of the first load compensation capacitor Clm1 may include a first end portion 521 that protrudes toward the first pixel circuit PC1. A first conductive layer 541 having an island-type (e.g., an island shape or a plate shape) and overlapping with the first end portion 521 may be disposed on the first end portion 521. The first conductive layer 541 may be positioned on the fifth insulating layer 115, and may be connected to the first end portion 521 via a contact hole Cnt1 that extends (e.g., passes) through an insulating layer between the first conductive layer 541 and the first end portion 521, for example, the third insulating layer 113 and the fifth insulating layer 115.

An end portion WL1p that extends from the first output line WL1 may be positioned on the first conductive layer 541, and the end portion WL1p of the first output line WL1 may be connected to the first conductive layer 541 via a second contact hole Cnt2 that extends (e.g., passes) through the sixth insulating layer 116 between the end portion WL1p and the first conductive layer 541. The second contact hole Cnt2 may not overlap with or may overlap with the first contact hole Cnt1. The end portion WL1p of the first output line WL1 may be connected to the data line DL. For example, the first output line WL1 and the data lines DL may include the same or substantially the same material as each other and may be connected to each other (e.g., to one another) as one body (e.g., as a unitary component).

Portions of the data line DL that extend (e.g., pass) through (e.g., across) a column of the pixel circuits PC, the second electrode 520 of the load compensation capacitor Clm, and the first output line WL1 may be electrically connected to each other (e.g., to one another) through the structure of the first connection portion 210 described above, as shown in FIG. 8. Thus, as described above with reference to FIGS. 6 through 7B, the test signal output from the sub-test circuit may be provided to the data line DL that is connected to the first pixel circuit PC1 and to the second electrode 520 of the first load compensation capacitor Clm1 via the first output line WL1.

Each of the first electrode 510 and the third electrode 530 of the first load compensation capacitor Clm1 may have the same or substantially the same voltage level as that of the power voltage line PL that extends (e.g., passes) through (e.g., across) the column of the first pixel circuits PC1, for example. In an embodiment, each of the first electrode 510 and the third electrode 530 of the first load compensation capacitor Clm1 may be electrically connected to the power voltage line PL that extends (e.g., passes) through (e.g., across) the column of the first pixel circuits PC1.

Referring to FIGS. 8 and 12, the first electrode 510 may include a first end portion 511 that protrudes in one direction, for example, in a direction toward the pixel circuit PC. An end portion PLp of the power voltage line PL may be positioned on the first end portion 511. The end portion PLp of the power voltage line PL may have a width that is greater than a width of the power voltage line PL, as shown in FIG. 8. The power voltage line PL may be positioned on the fifth insulating layer 115, and may include the same or substantially the same material as that of the first connection electrode described above with reference to FIG. 4, for example, Al, Cu, and/or Ti.

The end portion PLp of the power voltage line PL may overlap with the first end portion 511 of the first electrode 510. The end portion PLp of the power voltage line PL may be connected to the first end portion 511 of the first electrode 510 via a contact hole Cnt3 that extends (e.g., passes) through an insulating layer between the end portion PLp of the power voltage line PL and the first end portion 511 of the first electrode 510, for example, the second insulating layer 112, the third insulating layer 113, and the fifth insulating layer 115.

Referring to FIGS. 8 and 13, the third electrode 530 may include a first end portion 531 that protrudes in one direction, for example, in a direction toward the pixel circuit PC. The end portion PLp of the power voltage line PL may be positioned on the first end portion 531. The end portion PLp of the power voltage line PL may overlap with the first end portion 531 of the third electrode 530, and may be connected to the first end portion 531 of the third electrode 530 via a fourth contact hole Cnt4. For example, the end portion PLp of the power voltage line PL may be connected to the first end portion 531 of the third electrode 530 via the fourth contact hole Cnt4 that extends (e.g., passes) through an insulating layer between the end portion PLp of the power voltage line PL and the first end portion 531 of the third electrode 530, for example, the fifth insulating layer 115.

The structure of the second connection portion 220 and/or the structure of the third connection portion 230 may be the same or substantially the same as the structure of the first connection portion 210 described with reference to FIG. 11. For example, the second connection portion 220 may have a structure in which an end portion of the second output line WL2, an island-type (e.g., an island shaped or a plate shaped) conductive layer, and end portions of the second electrode 520 of the second load compensation capacitor Clm2 that are adjacent to the green pixel PXg are connected to each other (e.g., to one another), and a structure in which the end portion of the second output line WL2 is connected to the corresponding data line DL. The second connection portion 220 may correspond to the second node N2 illustrated in FIGS. 7A and 7B described above. Portions of the data line DL that extend (e.g., pass) through (e.g., across) the column of the second pixel circuits PC2, the second electrode 520 of the second load compensation capacitor Clm2, and the end portion of the second output line WL2 may be electrically connected to each other (e.g., to one another) by the structure of the second connection portion 220. A test signal output from the sub-test circuit may be provided to the data line DL that is connected to the second pixel circuit PC2 and to the second electrode 520 of the second load compensation capacitor Clm2 via the second output line WL2.

Similarly, the third connection portion 230 may have a structure in which an end portion of the third output line WL3, an island-type (e.g., an island shaped or a plate shaped) conductive layer, and end portions of the second electrode 520 of the third load compensation capacitor Clm3 that are adjacent to the blue pixel PXb are connected to each other (e.g., to one another), and a structure in which the end portion of the third output line WL3 is connected to the corresponding data line DL. The third connection portion 230 may correspond to the third node N3 shown in FIGS. 7A and 7B described above. Portions of the data line DL that extend (e.g., pass) through (e.g., across) the column of the third pixel circuits PC3 and the second electrode 520 of the third load compensation capacitor Clm3 may be electrically connected to each other (e.g., to one another), and the test signal output from the sub-test circuit may be provided to the corresponding data line DL that is connected to the third pixel circuit PC3 and to the second electrode 520 of the third load compensation capacitor Clm3 via the third output line WL3.

In one or more of the embodiments described above with reference to FIGS. 8 through 13, each of the first through third load compensation capacitors Clm1, Clm2, and Clm3 that are adjacent to the first through third pixel circuits PC1, PC2, and PC3 corresponding to the red pixel, the green pixel, and the blue pixel, respectively, share the first electrode 510 and the third electrode 530 with each other. In another embodiment, electrodes of the first through third load compensation capacitors Clm1, Clm2, and Clm3 may be separated from each other (e.g., from one another), for example, as shown in FIG. 14.

Figure 14:
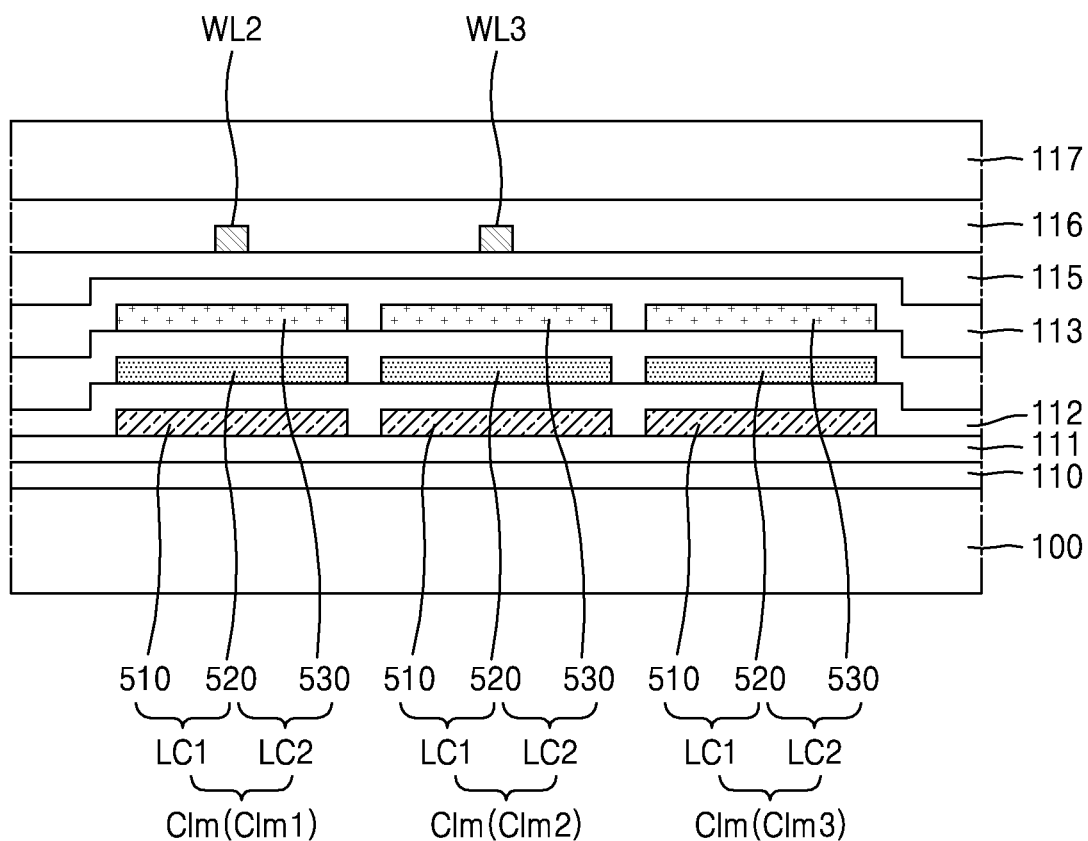
FIG. 14 is a cross-section view illustrating load compensation capacitors, according to an embodiment.

FIG. 14 is a cross-sectional view illustrating load compensation capacitors according to an embodiment. For example, FIG. 14 illustrates and embodiment that may correspond to a modified embodiment of FIG. 10.

Referring to FIGS. 8 and 14, each of the first through third load compensation capacitors Clm1, Clm2, and Clm3 may include at least two electrodes, for example, the first electrode 510, the second electrode 520, and the third electrode 530. The first through third electrodes 510, 520, and 530 provided in each of the first through third load compensation capacitors Clm1, Clm2, and Clm3 may be formed independently of (e.g., formed separately from) each other (e.g., one another). For example, the first electrode 510 provided in one load compensation capacitor Clm from among adjacent ones of the load compensation capacitors Clm may be spaced apart from the first electrode 510 provided in another load compensation capacitor Clm from among the adjacent ones of the load compensation capacitors Clm. Similarly, the second electrode 520 and/or the third electrode 530 provided in one load compensation capacitor Clm may be spaced apart from the second electrode 520 or the third electrode 530 provided in another load compensation capacitor Clm.

In the embodiment described above with reference to FIG. 8, lengths of the first through third load compensation capacitors Clm1, Clm2, and Clm3 that are adjacent to the pixel circuits of the red, green, and blue pixels corresponding to one load matching portion are different from each other (e.g., from one another). For example, a length of the first load compensation capacitor Clm1 that is adjacent to the first pixel circuit PC1 of the red pixel PXr, a length of the second load compensation capacitor Clm2 that is adjacent to the second pixel circuit PC2 of the green pixel PXg, and a length of the third load compensation capacitor Clm3 that is adjacent to the third pixel circuit PC3 of the blue pixel PXb may be different from each other (e.g., from one another). This reflects a difference between pixels that emit light having different colors, and may be distinguishable from the increase of the size and/or the area of the load matching capacitor included in each load matching portion CLM due to the distance between the load matching portion CLM (or the load matching capacitors thereof) and the first virtual line VL1 increasing (e.g., see FIGS. 5B and 15). This will be described in more detail below with reference to FIG. 15.

Figure 15:
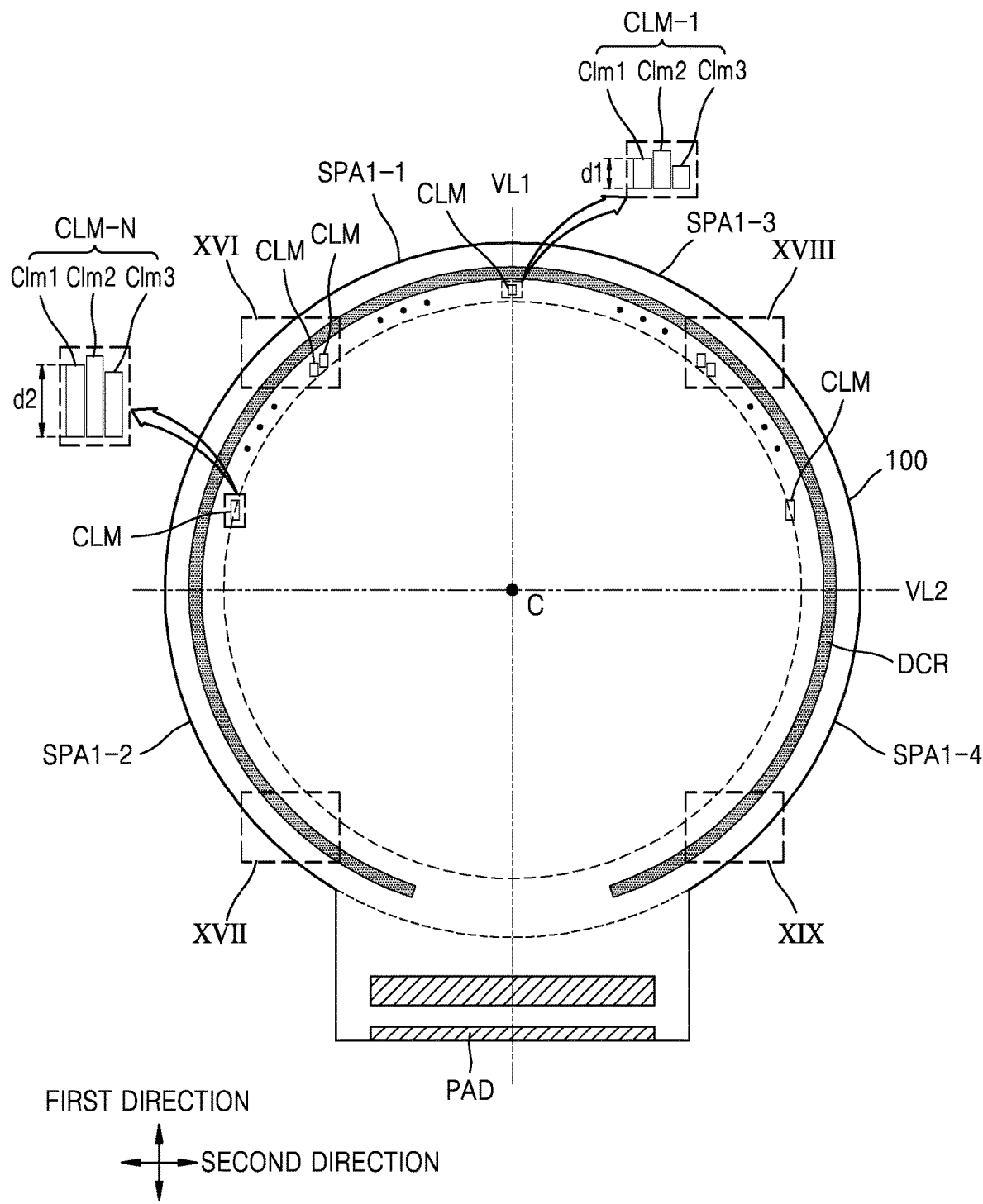
FIG. 15 is a plan view illustrating load matching portions of a display apparatus according to an embodiment.

FIG. 15 is a plan view illustrating a display apparatus according to an embodiment.

Referring to FIG. 15, the load matching portions CLM may be positioned at one side of a column of pixel circuits. In an embodiment, the load matching portions CLM may be positioned at a side that is opposite to a side of the pad "PAD" relative to (e.g., based on) the second virtual line VL2 that crosses the center of the display area DA and extends in the second direction. Each load matching portion CLM may include a plurality of load compensation capacitors, for example, the first through third load compensation capacitors Clm1, Clm2, and Clm3.

The lengths of the load compensation capacitors that are provided in each load matching portion CLM may vary (e.g., may be different from each other) according to the position (e.g., the location) of the load matching portion CLM. For example, a first length d1 of the first load compensation capacitor Clm1 of a first load matching portion CLM-1 that is relatively adjacent to the first virtual line VL1 may be less than a second length d2 of the first load compensation capacitor Clm1 of an N-th load matching portion CLM-N that is farther away from the first virtual line VL1 in the second direction than the first load matching portion CLM-1. Similarly, a length of the second load compensation capacitor Clm2 of the first load matching portion CLM-1 that is adjacent to the first virtual line VL1 may be less than a length of the second load compensation capacitor Clm2 of the N-th load matching portion CLM-N that is farther away from the first virtual line VL1 in the second direction than the first load matching portion CLM-1. A length of the third load compensation capacitor Clm3 of the first load matching portion CLM-1 that is adjacent to the first virtual line VL1 may be less than a length of the third load compensation capacitor Clm3 of the N-th load matching portion CLM-N that is farther away from the first virtual line VL1 in the second direction than the first load matching portion CLM-1.

As used herein, the phrase a "length of one load matching capacitor is less than a length of another load matching capacitor" may refer to a case where an overlapping area of electrodes of the one load matching capacitor described above is less than an overlapping area of electrodes of the other load matching capacitor. In an embodiment, a capacitance of the one load matching capacitor described above may be relatively less than a capacitance of the other load matching capacitor.

The driving circuit region DCR at (e.g., in or on) which the driving circuits are disposed may be at (e.g., in or on) the outer area PA. The driving circuits that are positioned at (e.g., in or on) the driving circuit region DCR may vary (e.g., may be different) according to positions (e.g., locations)

thereof. An arrangement of the driving circuits will be described in more detail below with reference to FIGS. 16 through 19.

Figure 16:
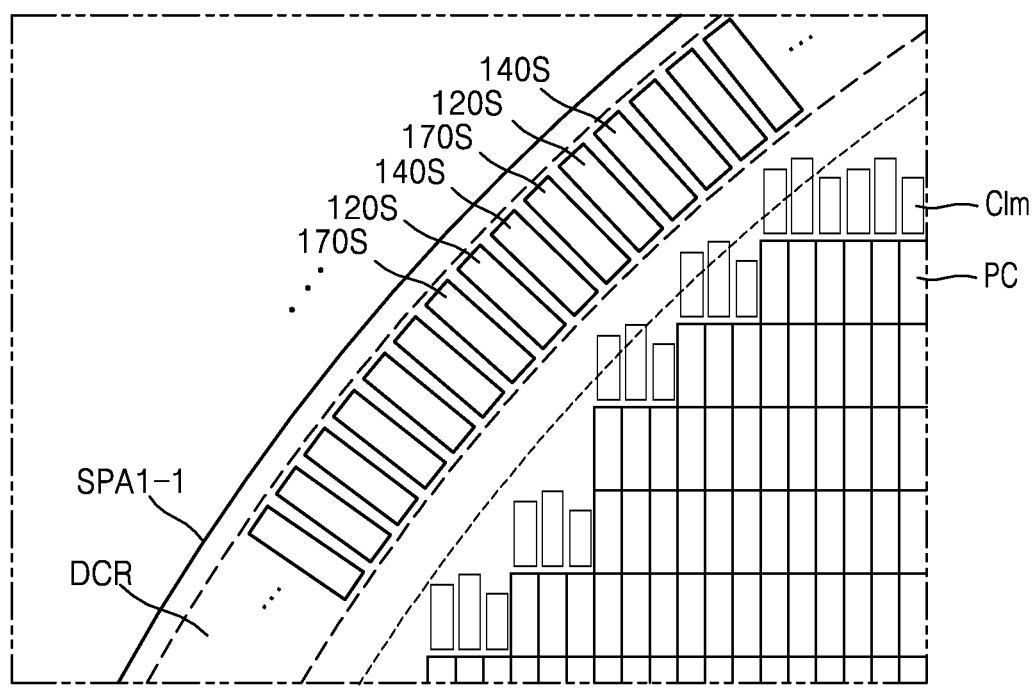
FIG. 16 is an enlarged plan view of the portion XVI of FIG. 15 of a display apparatus.
Figure 17:
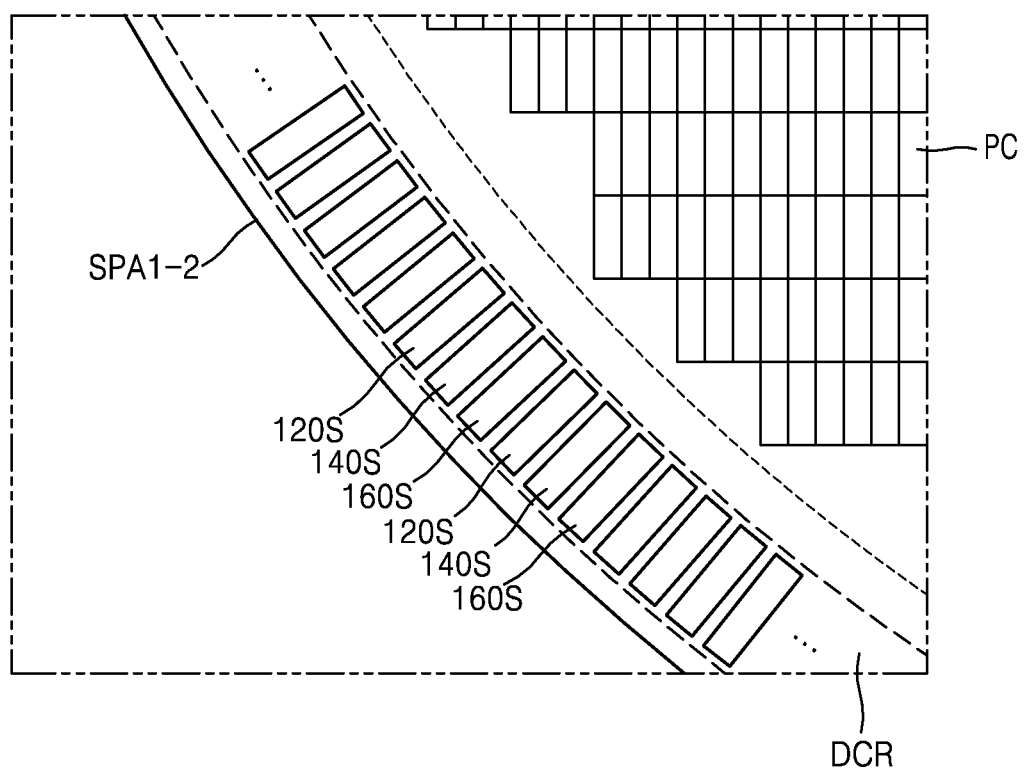
FIG. 17 is an enlarged plan view of the portion XVII of FIG. 15 of a display apparatus.
Figure 18:
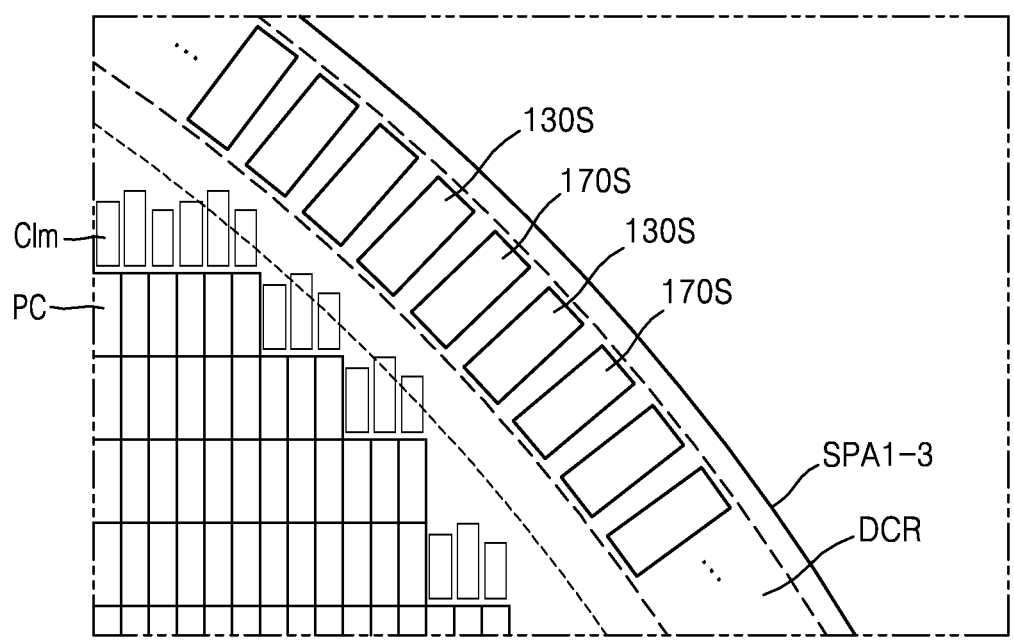
FIG. 18 is an enlarged plan view of the portion XVIII of FIG. 15 of a display apparatus.
Figure 19:
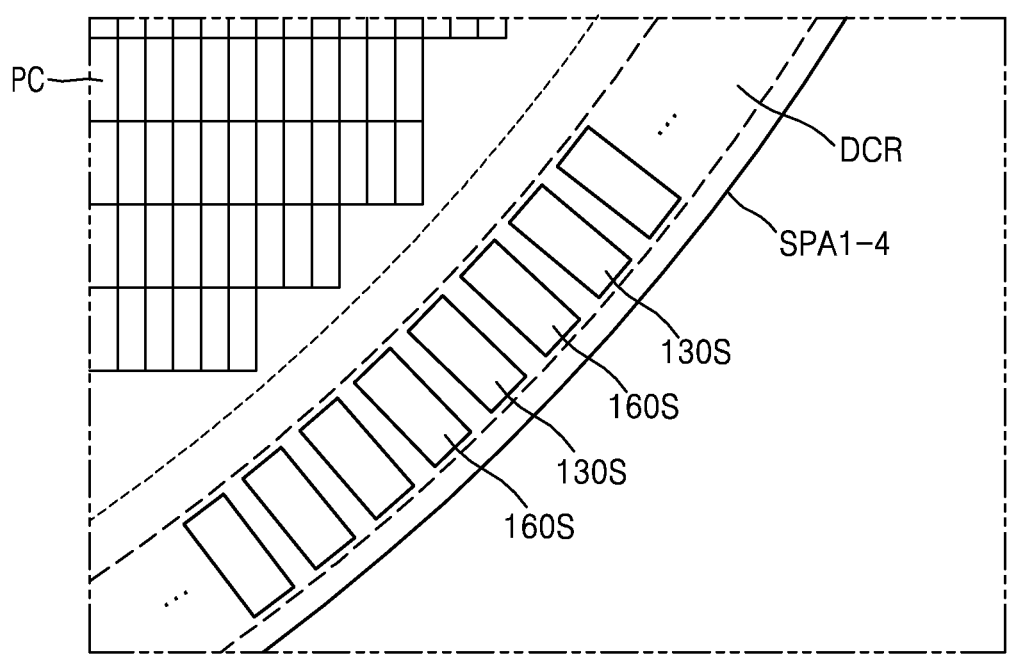
FIG. 19 is an enlarged plan view of the portion XIX of FIG. 15 of a display apparatus.

FIG. 16 is an enlarged plan view of the portion XVI of the display apparatus shown in FIG. 15, FIG. 17 is an enlarged plan view of the portion XVII of the display apparatus shown in FIG. 15, FIG. 18 is an enlarged plan view of the portion XVIII of the display apparatus shown in FIG. 15, and FIG. 19 is an enlarged plan view of the portion XIX of the display apparatus shown in FIG. 15.

Referring to FIG. 16, a plurality of sub-first scan driving circuits 120S, which may be sub-circuits of the first scan driving circuit 120 (e.g., see FIG. 1), a plurality of sub-emission control circuits 140S, which may be sub-circuits of the emission control circuit 140 (e.g., see FIG. 1), and a plurality of sub-test circuits 170S, which may be sub-circuits of the test circuit 170 (e.g., see FIG. 1), may be disposed (e.g., alternately disposed) at (e.g., in or on) a first sub-outer area SPA1-1.

Referring to FIG. 17, a plurality of the sub-first scan driving circuits 120S, which may be sub-circuits of the first scan driving circuit 120, a plurality of the sub-emission control circuits 140S, which may be sub-circuits of the emission control circuit 140, and a plurality of sub-data distribution circuits 160S, which may be sub-circuits of the data distribution circuit 160 (e.g., see FIG. 1), may be disposed (e.g., alternately disposed) at (e.g., in or on) a second sub-outer area SPA1-2.

Referring to FIG. 18, a plurality of sub-second scan driving circuits 130S, which may be sub-circuits of the second scan driving circuit 130 (e.g., see FIG. 1) and a plurality of the sub-test circuits 170S, which may be sub-circuits of the test circuit 170, may be disposed (e.g., alternately disposed) at (e.g., in or on) a third sub-outer area SPA1-3.

Referring to FIG. 19, a plurality of the sub-second scan driving circuits 130S, which may be sub-circuits of the second scan driving circuit 130, and a plurality of the sub-data distribution circuits 160S, which may be sub-circuits of the data distribution circuit 160, may be disposed (e.g., alternately disposed) at (e.g., in or on) a fourth sub-outer area SPA1-4.

In the display apparatus according to one or more embodiments, a load difference caused by the shape of the non-quadrangular display area may be prevented or reduced, and a high-quality display apparatus that efficiently utilizes (e.g., makes full use of) the space of the display apparatus may be provided.

It should be understood that embodiments described herein should be considered in a descriptive sense only and not for purposes of limitation. Descriptions of features and/or aspects within each embodiment should typically be considered as available for other similar features and/or aspects in other embodiments. While one or more embodiments have been described with reference to the figures, it will be understood by those of ordinary skill in the art that various modifications in form and/or details may be made therein without departing from the spirit and scope of the present disclosure as defined by the following claims, and their equivalents.

What is claimed is:

1. A display apparatus comprising:
   a plurality of pixel circuits in a display area having a non-quadrangular shape;
   a plurality of light emitting diodes in the display area, and electrically connected to the plurality of pixel circuits;
   a first sub-scan driving circuit in a non-display area outside of the display area, and electrically connected to a first row of pixel circuits from among the plurality of pixel circuits located along a first direction;
   a sub-emission control circuit in the non-display area, and electrically connected to the first row of pixel circuits;
   a plurality of data lines electrically connected to the plurality of pixel circuits, the plurality of data lines comprising:
      a first data line electrically connected to a first column of pixel circuits from among the plurality of pixel circuits located along a second direction crossing the first direction; and
      a second data line electrically connected to a second column of pixel circuits from among the plurality of pixel circuits located along the second direction;
   a first load compensation capacitor comprising:
      a first electrode electrically connected to a first power voltage line; and
      a second electrode overlapping with the first electrode of the first load compensation capacitor, and electrically connected to the first data line; and
   a second load compensation capacitor comprising:
      a first electrode electrically connected to a second power voltage line; and
      a second electrode overlapping with the first electrode of the second load compensation capacitor, and electrically connected to the second data line.

2. The display apparatus of claim 1, wherein a length of the second electrode of the first load compensation capacitor and a length of the second electrode of the second load compensation capacitor are different from each other.

3. The display apparatus of claim 2, wherein the first load compensation capacitor and the second load compensation capacitor are adjacent to each other.

4. The display apparatus of claim 1, wherein the first electrode of the first load compensation capacitor and the first electrode of the second load compensation capacitor are coupled unitarily.

5. The display apparatus of claim 1, wherein:
   the first load compensation capacitor further comprises a third electrode overlapping the first and second electrodes of the first load compensation capacitor and electrically connected to the first power voltage line; and
   the second load compensation capacitor further comprises a third electrode overlapping the first and second electrodes of the second load compensation capacitor and electrically connected to the second power voltage line.

6. The display apparatus of claim 5, wherein the third electrode of the first load compensation capacitor and the third electrode of the second load compensation capacitor are coupled unitarily.

7. The display apparatus of claim 1, wherein:
   a first connection portion of the second electrode of the first load compensation capacitor and the first data line is adjacent to an outmost pixel circuit of the first column of pixel circuits; and
   a second connection portion of the second electrode of the second load compensation capacitor and the second data line is adjacent to an outmost pixel circuit of the second column of pixel circuits.

8. The display apparatus of claim 7, further comprising:
   a first conductive layer connecting the second electrode of the first load compensation capacitor to the first data line; and a second conductive layer connecting the second electrode of the second load compensation capacitor to the second data line.

9. The display apparatus of claim 1, wherein a third connection portion of the first electrode of the first load compensation capacitor and the first power voltage line is adjacent to an outmost pixel circuit of the first column of pixel circuits.

10. The display apparatus of claim 1, further comprising a sub-test circuit in the non-display area, and electrically connected to the first and second load compensation capacitors.

11. The display apparatus of claim 10, wherein the sub-test circuit is adjacent to the first sub-scan driving circuit or the sub-emission control circuit.

12. The display apparatus of claim 10, further comprising:
a first output line electrically connecting the sub-test circuit to the first load compensation capacitor; and
a second output line electrically connecting the sub-test circuit to the second load compensation capacitor.

13. The display apparatus of claim 12, wherein the first output line or the second output line overlaps with the first load compensation capacitor.

14. The display apparatus of claim 11, wherein the non-display area comprises a first non-display area and second non-display area, which are opposite to a first virtual line crossing a center of the display area in the first direction, and
wherein the first load compensation capacitor, the second load compensation capacitor, and the sub-test circuit are located in the first non-display area.

15. The display apparatus of claim 14, further comprising a pad in the second non-display area.

16. The display apparatus of claim 14, wherein the display area has a circular shape, an oval shape, or a curved polygonal shape.

17. The display apparatus of claim 1, wherein the plurality of data lines further comprises a third data line electrically connected to a third column of pixel circuits,
wherein the third data line is closer to a virtual line than the first and second data lines, and the virtual line crosses a center of the display area in the second direction, and
wherein the display apparatus further comprises a third load compensation capacitor electrically connected to the third data line, a length of the third load compensation capacitor being less than a length of the first load compensation capacitor.

18. The display apparatus of claim 17, wherein the third load compensation capacitor comprises:
a first electrode electrically connected to a third power voltage line; and
a second electrode overlapping with the first electrode of the third load compensation capacitor, and electrically connected to the third data line, and
wherein the third load compensation capacitor is closer to the virtual line than the first and second load compensation capacitors.

19. The display apparatus of claim 1, wherein the first power voltage line and the second power voltage line have the same voltage level as each other.

* * * * *